(12) United States Patent
Schmidt et al.

(10) Patent No.: US 10,079,281 B2
(45) Date of Patent: Sep. 18, 2018

(54) SEMICONDUCTOR DEVICES AND METHODS FOR FORMING A SEMICONDUCTOR DEVICE

(71) Applicant: Infineon Technologies AG, Neubiberg (DE)

(72) Inventors: Gerhard Schmidt, Wernberg-Wudmath (AT); Erwin Lercher, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/434,208

(22) Filed: Feb. 16, 2017

(65) Prior Publication Data
US 2017/0243940 A1     Aug. 24, 2017

(30) Foreign Application Priority Data

Feb. 18, 2016    (DE) .......... 10 2016 102 861

(51) Int. Cl.
*H01L 29/78*     (2006.01)
*H01L 21/761*     (2006.01)
(Continued)

(52) U.S. Cl.
CPC .......... *H01L 29/1095* (2013.01); *H01L 21/04* (2013.01); *H01L 21/2253* (2013.01); *H01L 21/266* (2013.01); *H01L 21/34* (2013.01); *H01L 21/40* (2013.01); *H01L 21/761* (2013.01); *H01L 21/76202* (2013.01); *H01L 29/0619* (2013.01);
(Continued)

(58) Field of Classification Search
CPC ............. H01L 29/7811; H01L 29/7823; H01L 29/1095; H01L 29/7397; H01L 29/7813; H01L 29/4236; H01L 29/66348; H01L 29/66712; H01L 29/0619; H01L 29/402; H01L 29/0684; H01L 21/761;
(Continued)

(56) References Cited

U.S. PATENT DOCUMENTS

| 5,751,024 A | 5/1998 | Takahashi |
| 7,800,168 B2 | 9/2010 | Ogura et al. |

(Continued)

FOREIGN PATENT DOCUMENTS

DE     102005004355 A1     8/2006

OTHER PUBLICATIONS

Bothe, Karsten et al., "Electronically Activated Boron-Oxygen-Related Recombination Centers in Crystalline Silicon", Journal of Applied Physics, 2006 American Institute of Physics, vol. 99, Jan. 3, 2006, pp. 1-11.

*Primary Examiner* — Thanhha Pham
(74) *Attorney, Agent, or Firm* — Murphy, Bilak & Homiller, PLLC

(57) ABSTRACT

A method for forming a semiconductor device includes incorporating dopants of a first conductivity type into a nearby body region portion of a semiconductor substrate having a base doping of the first conductivity type. The incorporation of the dopants of the first conductivity type is masked by a mask structure at at least part of an edge region of the semiconductor substrate. The method further includes forming a body region of a transistor structure of a second conductivity type in the semiconductor substrate. The nearby body region portion of the semiconductor substrate is located adjacent to the body region of the transistor structure.

9 Claims, 13 Drawing Sheets

(51) Int. Cl.
    *H01L 21/266* (2006.01)
    *H01L 21/04* (2006.01)
    *H01L 21/34* (2006.01)
    *H01L 21/40* (2006.01)
    *H01L 29/06* (2006.01)
    *H01L 29/40* (2006.01)
    *H01L 29/10* (2006.01)
    *H01L 21/762* (2006.01)
    *H01L 21/225* (2006.01)
    *H01L 29/423* (2006.01)
    *H01L 29/739* (2006.01)
    *H01L 29/66* (2006.01)

(52) U.S. Cl.
    CPC ........ *H01L 29/0684* (2013.01); *H01L 29/402* (2013.01); *H01L 29/4236* (2013.01); *H01L 29/66348* (2013.01); *H01L 29/66712* (2013.01); *H01L 29/7397* (2013.01); *H01L 29/7811* (2013.01); *H01L 29/7813* (2013.01); *H01L 29/7823* (2013.01)

(58) Field of Classification Search
    CPC ....... H01L 21/266; H01L 21/04; H01L 21/34; H01L 21/40; H01L 21/2253
    See application file for complete search history.

(56) References Cited

U.S. PATENT DOCUMENTS

| | | | |
|---|---|---|---|
| 7,880,272 B2 * | 2/2011 | Schmidt | H01L 29/0615 257/611 |
| 8,361,893 B2 | 1/2013 | Schmidt et al. | |
| 9,324,783 B2 | 4/2016 | Falck et al. | |
| 9,337,270 B2 | 5/2016 | Pfirsch et al. | |
| 2014/0084333 A1 | 3/2014 | Nakamura et al. | |
| 2014/0124851 A1 | 5/2014 | Gamerith et al. | |
| 2015/0214347 A1 | 7/2015 | Falck et al. | |

* cited by examiner

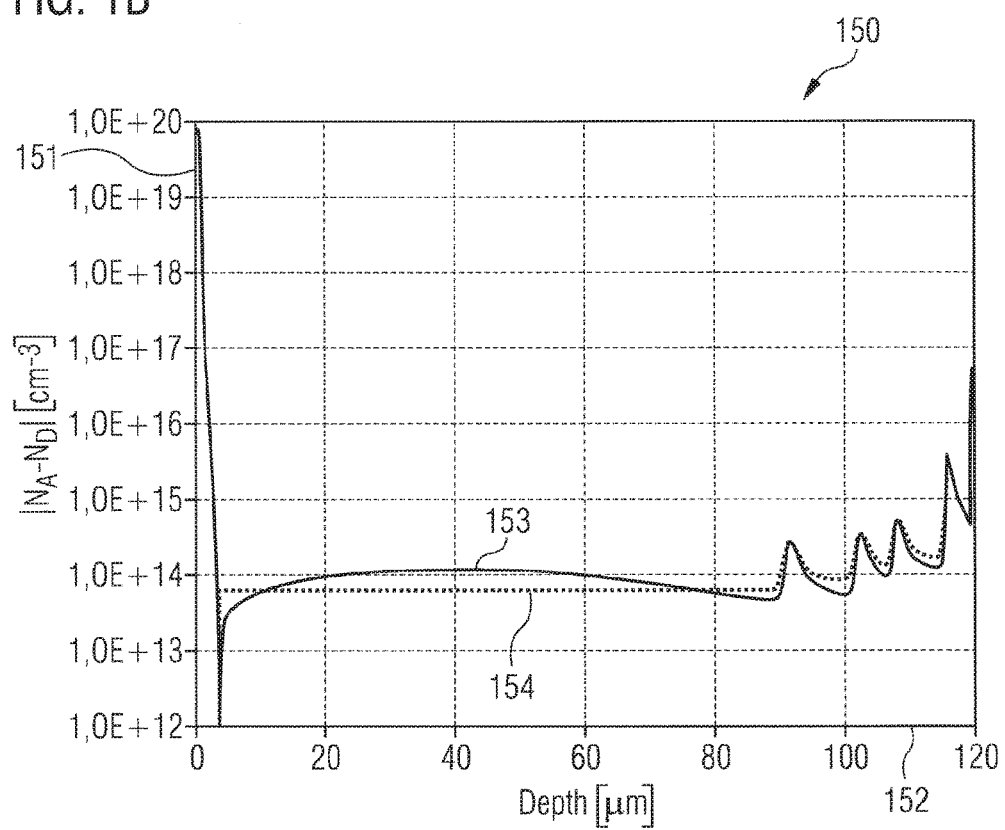

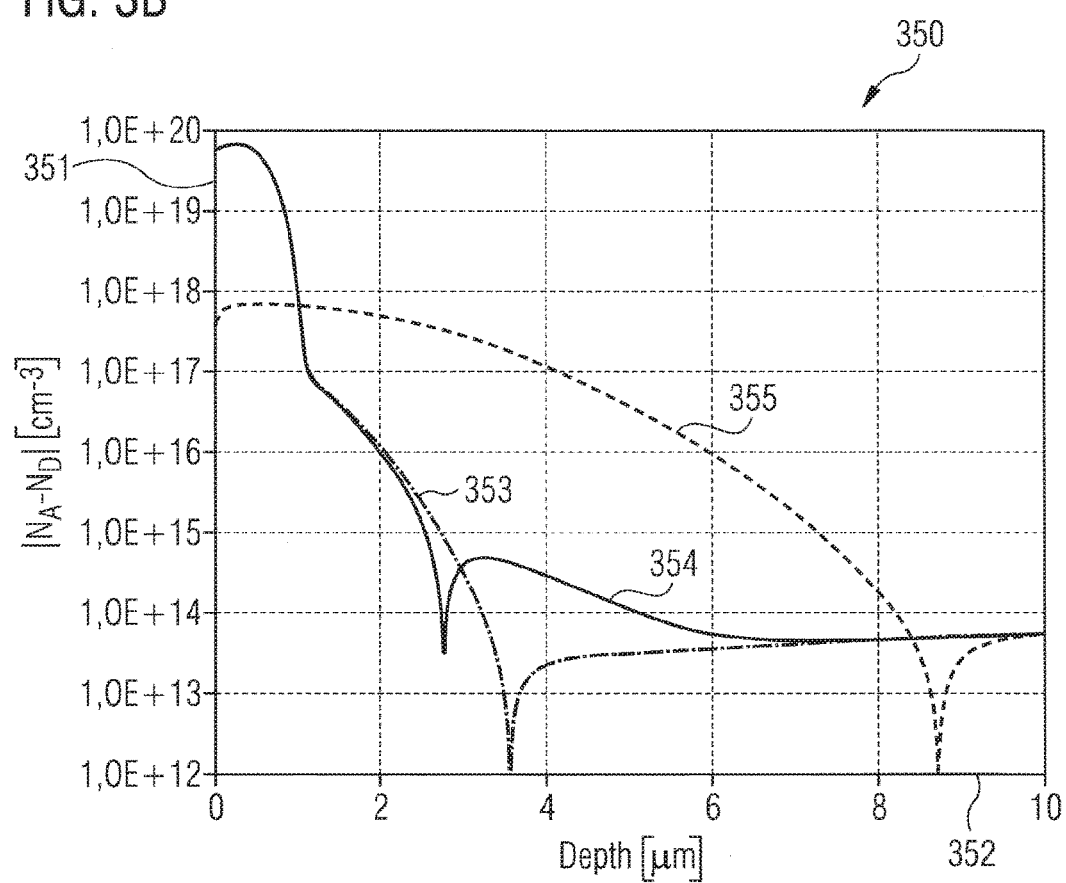

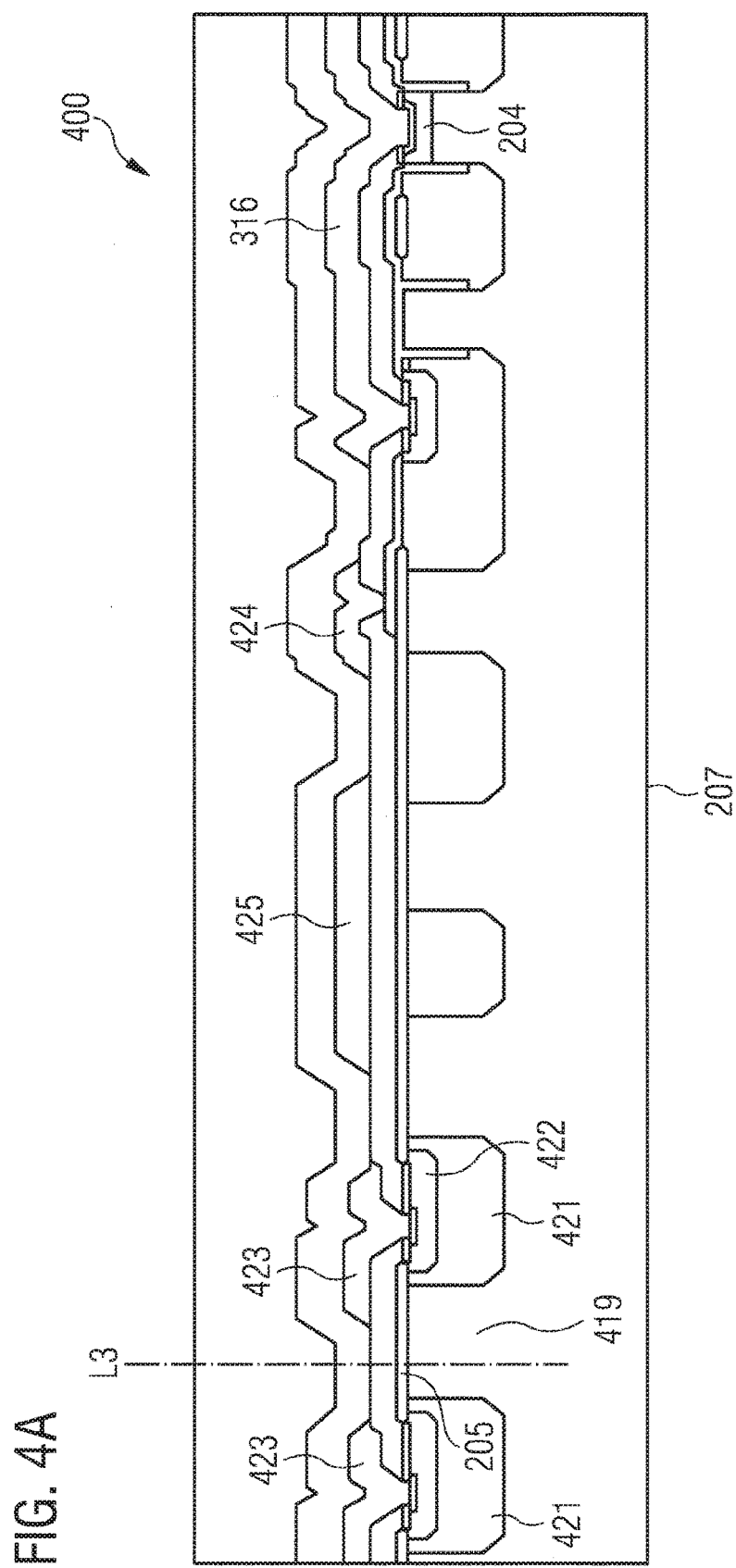

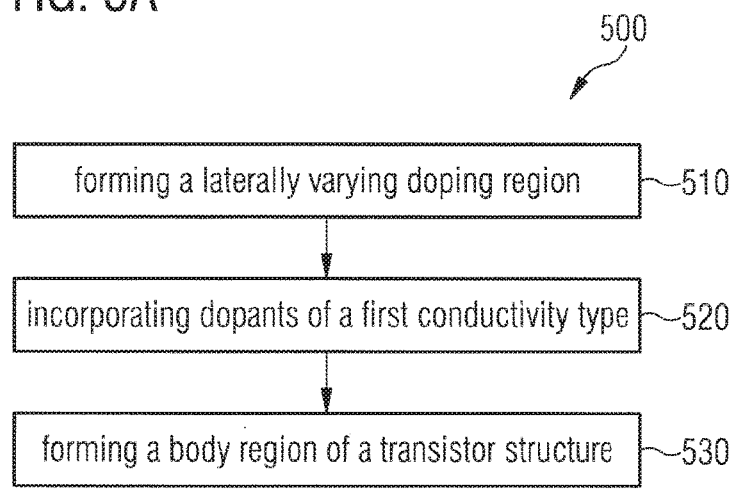
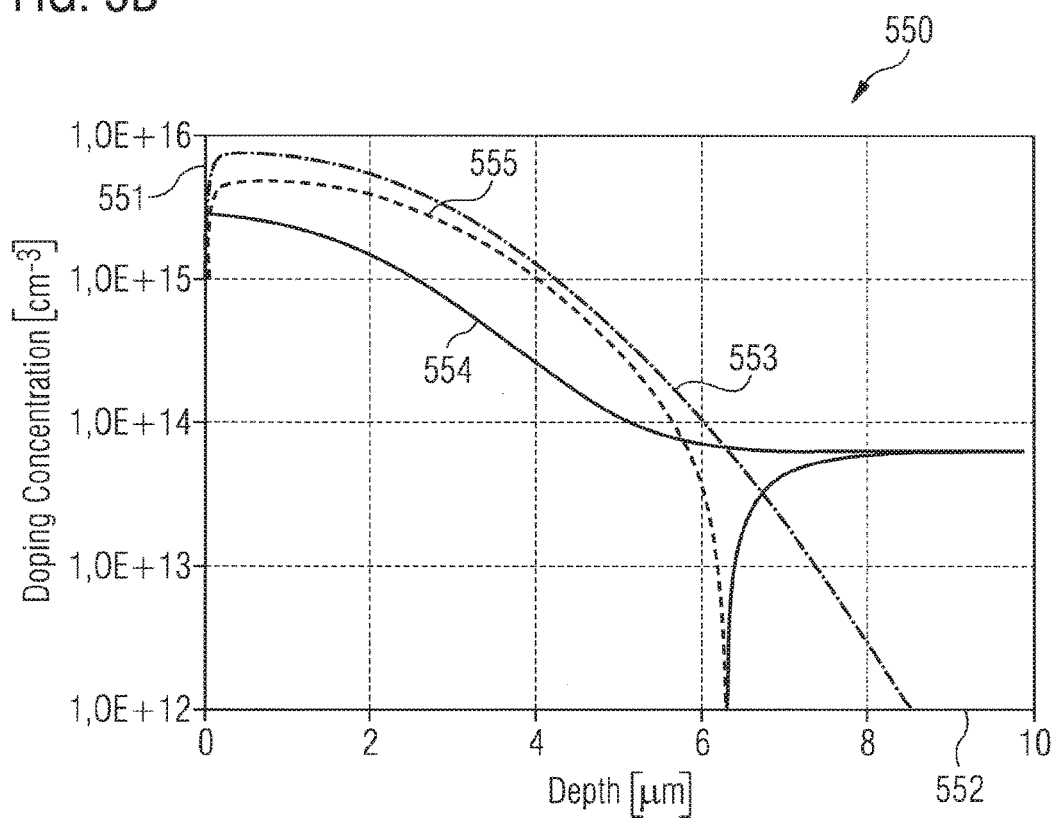

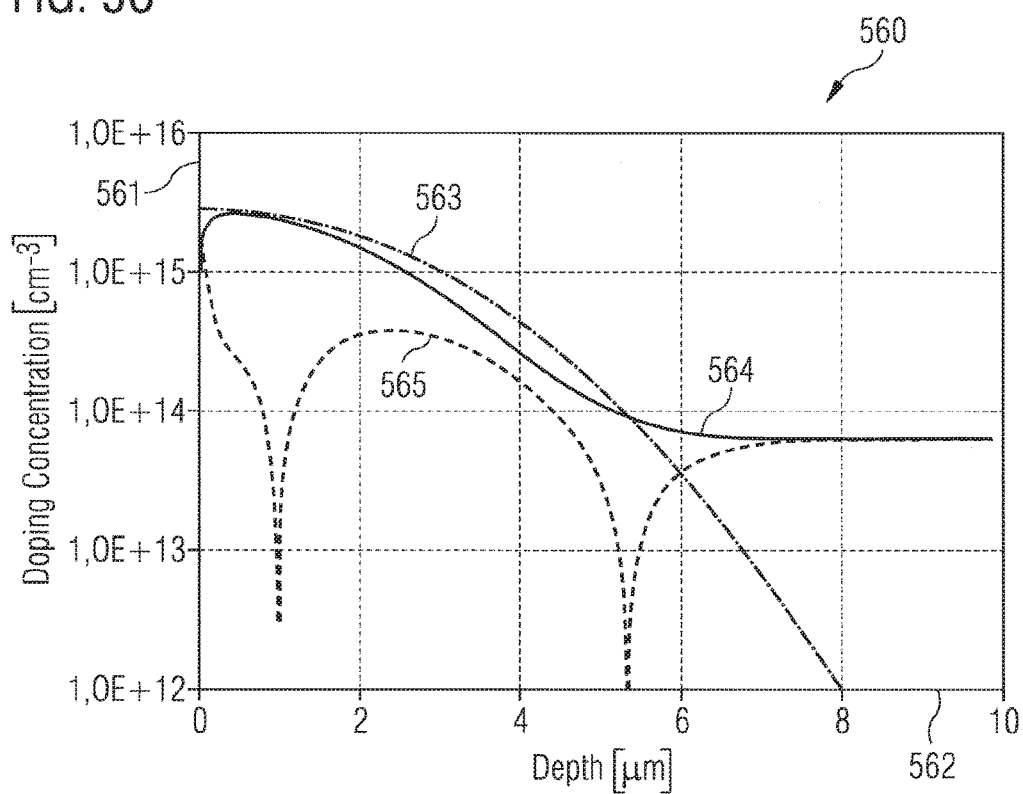

and into at least a surface portion of the semiconductor substrate located between the laterally varying doping region and a surface of the semiconductor substrate during the same incorporation process before or after forming the laterally varying doping region. A number of dopants of the first conductivity type in the surface portion is larger than a number of dopants of the second conductivity type in the surface portion. The method further comprises forming a body region of a transistor structure of a second conductivity type in the semiconductor substrate. The nearby body region portion of the semiconductor substrate is located adjacent to the body region of the transistor structure.

SEMICONDUCTOR DEVICES AND METHODS FOR FORMING A SEMICONDUCTOR DEVICE

TECHNICAL FIELD

Embodiments relate to semiconductor device structures, and in particular to semiconductor devices and methods for forming a semiconductor device.

BACKGROUND

The formation of semiconductor substrates by Czochralski (CZ) processes may suffer from unreliability due to oxygen complexes formed due to oxygen interstitials. Processes for reducing the effects of oxygen complexes (e.g. by magnetic CZ processes) may lead to fluctuations in the specific resistance of the semiconductor substrates. The processes for reducing these fluctuations in specific resistance may cause a doping profile of the semiconductor substrate that leads to deterioration in the switch on behavior of semiconductor devices formed in the semiconductor substrate. The formation of semiconductor substrates by Float Zone (FZ) processes may lead to semiconductor substrates with a lower proportion of oxygen. However, FZ processes may be expensive.

SUMMARY

Embodiments described herein provide semiconductor devices with improved switch-on behavior and/or improved forward voltage.

Some embodiments relate to a method for forming a semiconductor device. The method comprising incorporating dopants of a first conductivity type into a nearby body region portion of a semiconductor substrate comprising a base doping of the first conductivity type. The incorporation of the dopants of the first conductivity type is masked by a mask structure at at least part of an edge region of the semiconductor substrate. The method further comprises forming a body region of a transistor structure of a second conductivity type in the semiconductor substrate. The nearby body region portion of the semiconductor substrate is located adjacent to the body region of the transistor structure.

Some embodiments relate to a semiconductor device. The semiconductor device comprises a nearby body region portion of a drift region of a transistor structure located at a semiconductor substrate. The nearby body region portion is located within 1 µm of a p-n junction between a body region of the transistor structure and the drift region of the transistor structure. An average doping concentration of the nearby body region portion is greater than $5*10^{14}$ dopants per $cm^3$. The semiconductor device further comprises an insulation structure located on a surface of the semiconductor substrate at an edge region of a semiconductor substrate. An average doping concentration of at least a portion of the semiconductor substrate located at the same vertical depth in the semiconductor substrate as the nearby body region portion is less than $1*10^{14}$ dopants per $cm^3$.

Some embodiments relate to a further method for forming a semiconductor device. The method comprises forming a laterally varying doping region comprising a second conductivity type in an edge region of a semiconductor substrate. The method further comprises incorporating dopants of a first conductivity type into a nearby body region portion of the semiconductor substrate comprising a base doping of the first conductivity type and into at least a surface portion of the semiconductor substrate located between the laterally varying doping region and a surface of the semiconductor substrate during the same incorporation process before or after forming the laterally varying doping region. A number of dopants of the first conductivity type in the surface portion is larger than a number of dopants of the second conductivity type in the surface portion. The method further comprises forming a body region of a transistor structure of a second conductivity type in the semiconductor substrate. The nearby body region portion of the semiconductor substrate is located adjacent to the body region of the transistor structure.

Some embodiments relate to a further semiconductor device. The semiconductor device comprises a nearby body region portion of a drift region of a transistor structure located at a semiconductor substrate. The nearby body region portion is located within 1 µm of a p-n junction between a body region of the transistor structure and the drift region of the transistor structure. An average doping concentration of the nearby body region portion is greater than $5*10^{14}$ dopants per $cm^3$. The semiconductor device further comprises a laterally varying doping region comprising a second conductivity type located in an edge region of the semiconductor substrate. The semiconductor device further comprises a surface portion of the semiconductor substrate comprising the first conductivity type located between a surface of the semiconductor substrate and the laterally varying doping region.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which:

FIG. 1B shows a graphical illustration of net doping concentration vs depth of a body region of a transistor structure;

FIG. 3B shows a graphical illustration of net doping concentration vs depth in various portions of a semiconductor device:

FIG. 4A shows a schematic illustration of a further semiconductor device;

FIG. 5A shows a schematic illustration of a flow chart of a further method for forming a semiconductor device:

FIG. 5B shows a graphical illustration of doping concentration vs depth at an edge region of the semiconductor substrate;

FIG. 5C shows a graphical illustration of doping concentration vs depth at an edge region of the semiconductor substrate using different doses;

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1A:
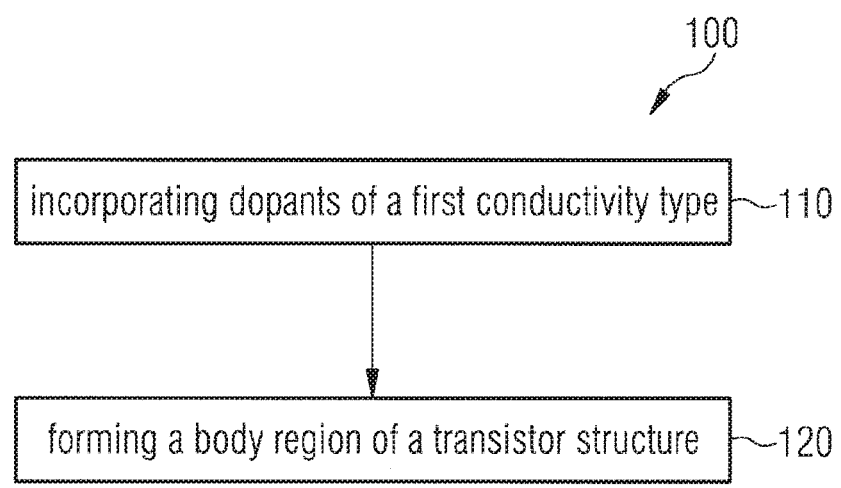
FIG. 1A shows a schematic illustration of a flow chart of a method for forming a semiconductor device.

FIG. 1A shows a schematic illustration of a flow chart of a method 100 for forming the semiconductor device.

The method 100 comprising incorporating 110 dopants of a first conductivity type into a nearby body region portion of a semiconductor substrate comprising a base doping of the first conductivity type. The incorporation 110 of the dopants of the first conductivity type is masked by a mask structure at at least part of an edge region of the semiconductor substrate.

The method 100 further comprises forming 120 a body region of a transistor structure of a second conductivity type in the semiconductor substrate. The nearby body region portion of the semiconductor substrate is located adjacent to the body region of the transistor structure.

Due to the incorporation 110 of the dopants of the first conductivity type into the nearby body region portion of the semiconductor substrate, a doping concentration of the nearby body region portion being too low and leading to a deterioration of the switch-on behavior of the transistor structure may be avoided. Thus, an improved switch-on behavior of the transistor structure and an improved drop in forward voltage of the transistor structure may be achieved. Due to the incorporation 110 of the dopants of the first conductivity type being masked by a mask structure at at least part of an edge region of the semiconductor substrate, a local increase in a doping concentration of the edge region (e.g. an increase in the base doping of the edge region) may be prevented or reduced, and thus, a reduction of the blocking voltage of the transistor structure may be prevented or reduced.

The method 100 comprises incorporating 110 the dopants of the first conductivity type (e.g. n-type conductivity) into the nearby body region portion of a semiconductor substrate. The incorporated dopants may enter the semiconductor substrate from an implantation surface (e.g. a first lateral surface) of the semiconductor substrate, for example. The dopants of the first conductivity type may be incorporated (e.g. by ion implantation) with an implantation dose of between $1*10^{11}$ dopants per $cm^2$ and $1.5*10^{12}$ dopants per $cm^2$ (or e.g. between $2*10^{11}$ dopants per $cm^2$ and $9*10^{11}$ dopants per $cm^2$, or e.g. between $2*10^{11}$ dopants per $cm^2$ and $7*10^{11}$ dopants per $cm^2$, or e.g. $3*10^{11}$ dopants per $cm^2$, or e.g. $6*10^{11}$ dopants per $cm^2$), for example.

The dopants of the first conductivity type are incorporated 110 into the nearby body region portion of the semiconductor substrate, which is located adjacent (e.g. directly adjacent) to a body region to be formed. For example, the body region is not yet formed during the incorporating 110 of the dopants of the first conductivity type into the nearby body region portion of the semiconductor substrate.

The semiconductor substrate comprises a base (or bulk) doping of the first conductivity type (e.g. n-type conductivity). The base (or bulk) doping of the semiconductor substrate may be a doping of the semiconductor substrate after a semiconductor growth process (e.g. by a Czochralski CZ process, or e.g. a magnetic Czochralski MCZ process, or e.g. a float zone FZ process) to form the semiconductor substrate, but before the forming of doping regions (e.g. junctions) in the semiconductor substrate.

The average base doping concentration of the semiconductor substrate (e.g. before incorporating the dopants of the first conductivity type) may be at least $1*10^{12}$ dopants per $cm^3$ (or e.g. between $1*10^{12}$ dopants per $cm^3$ and $1*10^{14}$ dopants per $cm^3$, or e.g. between $2*10^{13}$ dopants per $cm^3$ and $8*10^{13}$ dopants per $cm^3$, or e.g. $6*10^{13}$ dopants per $cm^3$). The average base doping concentration of the semiconductor substrate may be a measured number of dopants per volume averaged over the semiconductor substrate, for example. For example, the average doping concentration of the base doping (average base doping concentration) of the semiconductor substrate may be larger than $1*10^{12}$ dopants per $cm^3$ (or larger than $1*10^{13}$ dopants per $cm^3$ or larger than $5*10^{13}$ dopants per $cm^3$) and/or lower than $1*10^{15}$ dopants per $cm^3$ (or lower than $5*10^{14}$ dopants per $cm^3$ or lower than $1*10^{14}$ dopants per $cm^3$). For example, the base doping may comprise a curved doping profile vertically increasing from a surface of the semiconductor substrate to a maximum at a depth larger than 20 µm (or larger than 30 µm) and/or smaller than 80 µm (or smaller than 60 µm).

The incorporation 110 of dopants of the first conductivity type may increase the (average) base doping of the semiconductor substrate by at least one order of magnitude within the nearby body region portion of the semiconductor substrate. For example, an average dopant concentration of the nearby body region portion of the semiconductor substrate may be at least $5*10^{11}$ dopants per $cm^3$ (or e.g. between $1*10^{14}$ dopants per $cm^3$ and $1*10^{16}$ dopants per $cm^3$, or e.g. between $5*10^{14}$ dopants per $cm^3$ and $5*10^{16}$ dopants per $cm^3$, or e.g. $1*10^{15}$ dopants per $cm^3$). The average base doping concentration of the nearby body region portion of the semiconductor substrate may be a measured number of dopants per volume averaged over the nearby body region portion of the semiconductor substrate, for example.

The incorporation 110 of the dopants of the first conductivity type is masked by the mask structure at at least part of an edge region of the semiconductor substrate. For example, the incorporation of the dopants of the first conductivity type into one or more portions of the edge region of the semiconductor substrate covered by the mask structure may be prevented (or reduced) by the mask structure.

The method 100 may include forming the mask structure at at least part of the edge region before incorporating 110 the dopants of the first conductivity type. For example, the mask structure may be formed at the surface (e.g. the first lateral surface) of the semiconductor substrate adjacent to (e.g. directly on and/or above) one or more portions of the semiconductor substrate having the first conductivity type in the edge region of the semiconductor substrate. The one or more portions of the semiconductor substrate having the first conductivity type in the edge region may have an average doping concentration equal to (or e.g. similar to) the average base doping concentration of the semiconductor substrate, for example.

The edge region of the semiconductor substrate may include one or more (or e.g. a plurality of) edge doping regions having the second conductivity type (e.g. p-type conductivity) located in the semiconductor substrate. The at least one edge doping region having the first conductivity type may be located laterally adjacent to at least one edge doping region having the second conductivity type located in the edge region of the semiconductor substrate, for example. Optionally, an edge doping region having the first conductivity type may be located laterally between neighboring (or consecutive) laterally spaced edge doping regions having the second conductivity type. The at least one edge doping region comprising the second conductivity type may be at least part of a field ring structure (and may optionally be formed together with a p-float region), for example.

The at least one edge doping region having the second conductivity type may be uncovered (e.g. not covered, or e.g. not masked) by the mask structure during the incorporation 110 of the dopants of the first conductivity type. Thus, the dopants of the first conductivity may be incorporated into the at least one edge doping region having the second conductivity type during the incorporation 110 of the dopants of the first conductivity type.

An (average) doping concentration of the at least one edge doping region having the second conductivity type may be at least $1*10^{17}$ dopants per $cm^3$ (or e.g. between $1*10^{17}$ dopants per $cm^3$ and $1*10^{20}$ dopants per $cm^3$, or e.g. between $1*10^{17}$ dopants per $cm^3$ and $1*10^{19}$ dopants per $cm^3$). The average doping concentration of the at least one edge doping region having the second conductivity type may be a measured number of dopants per volume averaged over the at least one edge doping region having the second conductivity type, for example.

The mask structure may mask the incorporation 110 of the dopants of the first conductivity type into at least one edge doping region having the first conductivity type extending from the surface of the semiconductor substrate into at least the depth of the nearby body region portion.

Optionally, the mask structure may be formed at the first lateral surface of the semiconductor substrate by a local oxidation of silicon (LOCOS) process. For example, the mask structure may include (or may be) an insulation (or dielectric) layer structure (e.g. a LOCOS structure). The dielectric layer structure (or LOCOS) mask structure may remain at (or on) the surface of the semiconductor substrate after the incorporation 110 of the dopants of the first conductivity type, and may remain a part of the finally formed semiconductor device, for example.

As an alternative to masking of the n-blanket implantation via the field oxide, an additional photo layer (or mask) may be used. For example, optionally, the mask structure may be a photolithographic mask structure formed at the first lateral surface of the semiconductor substrate. The photolithographic mask structure may be removed from the semiconductor substrate after the incorporation 110 of the dopants of the first conductivity type, for example.

The method 100 further comprises forming 120 the body region of (or having) the second conductivity type in the semiconductor substrate. The body region may be formed 120 after incorporating 110 the dopants of the first conductivity type into the nearby body region portion of the semiconductor substrate, for example. The forming 120 of the body region of the transistor structure may include incorporating dopants of the second conductivity type into the semiconductor substrate. For example, the doping concentration of the base doping at a depth equal to a maximal depth of the body region is lower than 80% (or lower than 60% or lower than 40%) of a maximal doping concentration of the base doping of the semiconductor substrate. The (portion of the semiconductor substrate comprising the) maximal doping concentration of the base doping may be located at a depth larger than 20 µm (or larger than 30 µm) and/or smaller than 80 µm (or smaller than 60 µm).

The method 100 may further include forming a source region of the transistor structure optionally after forming 120 the body region. The source region of the transistor structure may have the first conductivity type, for example. The source region may be formed by incorporating dopants of the first conductivity type into the semiconductor substrate.

The method 100 may further include activating the incorporated 110 dopants of the first conductivity type to form the nearby body region portion of the semiconductor substrate and activating the incorporated 120 dopants of the second conductivity type to form the body region. The method 100 may further include activating the incorporated dopants of the first conductivity type to form the source region of the transistor structure. Optionally, the activating of the incorporated dopants of the first conductivity type and the incorporated dopants of the second conductivity type may be carried out by thermal annealing in the same or different annealing process.

After the dopant activation (by annealing), the nearby body region portion may extend substantially vertically to a depth of at least 2 µm (or e.g. between 2 µm and 9 µm, or e.g. between 5 µm and 7 µm) from the first lateral surface of the semiconductor substrate.

After the dopant activation (by annealing), the body region may be located adjacent to the nearby body region portion of the semiconductor substrate. For example, the body region may extend substantially vertically to a depth of at least 2 µm (or e.g. between 2 µm and 4 µm, or e.g. between 2 µm and 3 µm) from the first lateral surface of the semiconductor substrate.

The incorporation 110 of dopants of the first conductivity type into the nearby body region portion of the semiconductor substrate (and the dopant activation by annealing) may increase the base doping of the semiconductor substrate within a depth of at least 1 µm (or e.g. between 1 µm and 3 µm, or e.g. between 1 µm and 2 µm) from a p-n junction between the body region and the drift region of the transistor structure.

After the dopant activation (by annealing), the body region of the transistor structure may be located deeper in the semiconductor substrate than the source region, for example. The body region may be located adjacent to (e.g. vertically below) the source region of the transistor structure.

The transistor structure may be a metal oxide semiconductor field effect transistor (MOSFET) cell or an insulated gate bipolar transistor (IGBT) cell, for example. For example, each transistor structure may include the source region having the first conductivity type (e.g. n+ doped), the body region having the second conductivity type (e.g. p-doped), the nearby body region having the first conductivity type (e.g. n-doped) and the drift region having the first conductivity type (e.g. n-doped). The body region, the source region, the nearby body region and/or the drift region may be located adjacently a gate trench structure at a sidewall (e.g. a first sidewall) of the gate trench structure.

The source region of the transistor structure formed by the method 100 may have an average doping concentration of more than $1*10^{18}$ dopants per cm$^3$ (or e.g. between $1*10^{18}$ dopants per cm$^3$ and $5*10^{19}$ dopants per cm$^3$). The average doping concentration may be a measured number of dopants per volume averaged over a region of interest of the source region of the transistor structure, for example.

The body region of the transistor structure may have an average doping concentration of between $5*10^{16}$ dopants per cm$^3$ and $1*10^{19}$ dopants per cm$^3$ (or e.g. between $2*10^{17}$ dopants per cm$^3$ and $1*10^{18}$ dopants per cm$^3$). The average doping concentration may be a measured number of dopants per volume averaged over a region of interest of the body region of the transistor structure, for example.

The drift region of the transistor structure may have the same base doping (or bulk doping) as the semiconductor substrate. For example, the drift region of the transistor structure may be formed during the formation (e.g. growth) of the semiconductor substrate or during doping of the bulk semiconductor substrate before the forming of any junctions or doping regions in the semiconductor substrate.

The transistor structure of the semiconductor device may be one of a plurality of transistor structures of the semiconductor device formed by the method 100.

In the case of the transistor structure being a MOSFET structure, the drift region of the transistor structure may be located between the body region of the transistor structure and a drain region of the transistor structure located at a second lateral surface (e.g. a back surface) of the semiconductor substrate. The drain region of the transistor structure may have the first conductivity type (e.g. n+ doped), for example.

In the case of the transistor structure being an IGBT structure, the drift region of the transistor structure may be located between the body region of the transistor structure and a collector region of the transistor structure located at the second lateral surface (e.g. the back surface) of the semiconductor substrate. The collector region of the transistor structure may have the second conductivity type (e.g. p+ doped). Optionally, a highly doped field stop region having the first conductivity type (e.g. n+ doped) may be formed between the drift region and the collector region of the transistor structure. Optionally, the highly doped field stop region may be formed between the nearby body region portion of the drift region and the collector region of the transistor structure. Optionally, the field stop region may be formed after forming the nearby body region of the transistor structure (e.g. after forming the source region, the body region and the nearby body region), for example.

The method 100 may further include forming the at least one gate trench structure (e.g. one or more gate trench structures, or e.g. a plurality of gate trench structures) of the transistor structure before incorporating 110 the dopants of the first conductivity type into the nearby body region portion of a semiconductor substrate (e.g. before forming the nearby body region, the body region and the source region), for example. The plurality of gate trench structures may be spaced laterally from each other in a first lateral direction. The gate trench structure of the transistor structure may extend from the first lateral surface (e.g. the front surface) of the semiconductor substrate substantially vertically into the semiconductor substrate. A (or each) gate trench structure of the transistor structure may include a gate oxide layer arranged on sidewalls (e.g. on a first sidewall and on a second sidewall) and at the bottom of a substantially vertical gate trench extending into the semiconductor substrate. The gate oxide layer of the gate trench structure may have a maximum thickness of less than 150 nm and a minimum thickness of more than 10 nm, for example.

The gate oxide layer and the mask structure (e.g. the LOCOS structure) may be formed before depositing an electrically conductive gate electrode material (e.g. polysilicon, or e.g. also referred to as gate poly) at the semiconductor substrate. At least part of the gate electrode material may be deposited in the gate trench (e.g. at least partially filling the gate trench) to form a gate electrode of the gate trench structure. Additionally, at least part of the gate electrode material may be deposited on (e.g. directly on) the mask structure to form a gate electrode material layer located on (e.g. directly on, or e.g. covering) the mask structure.

The method 100 may further include forming at least one floating doping region (e.g. one or more floating doping regions, or e.g. a plurality of floating doping regions) having the second conductivity type in the semiconductor substrate before forming the at least one gate trench structure (e.g. before etching the vertical gate trench). The at least one floating doping region (e.g. also referred to as a p-float region) may be located in an active cell region of the semiconductor substrate, for example. A (or each) floating doping region may extend substantially vertically into the semiconductor substrate from the first lateral surface of the semiconductor substrate to an average depth of at least 7 μm (or e.g. between 7 μm and 10 μm, or e.g. between 8 μm and 9 μm), for example. At least part of the floating doping region may be located between neighboring (or consecutive laterally spaced) gate trench structures. The floating doping region may extend laterally between a sidewall of a first gate trench structure and a sidewall of a second gate trench structure, for example. The floating doping region may be located adjacently to a bottom of each gate trench structure. For example, at least part of the floating doping region may extend from a second sidewall of the gate trench structure towards the first sidewall of the same gate trench structure.

The at least one floating doping region may have an average doping concentration of between $1*10^{16}$ dopants per cm$^3$ and $1*10^{18}$ dopants per cm$^3$, (or e.g. between $1*10^{16}$ dopants per cm$^3$ and $1*10^{17}$ dopants per cm$^3$). The average base doping concentration of the at least one floating doping region may be a measured number of dopants per volume averaged over the at least one floating doping region, for example.

The method 100 may further include forming an electrode structure and/or an insulation layer structure after incorporating 110 the dopants of the first conductivity type. In the case of the mask structure being a LOCOS structure, the mask structure is not removed from the surface of the semiconductor substrate. Thus, the electrode structure and/or the insulation layer structure may be formed on at least a part of the mask structure after incorporating 110 the dopants of the first conductivity type.

A first insulation layer structure (e.g. an oxide layer, or e.g. a silicon dioxide layer) may be formed on (or e.g. directly on) the gate electrode material layer located on the mask structure. The first insulation layer structure may electrically insulate the gate trench structure (e.g. the gate electrode and/or the gate electrode material layer) from other electrode structures formed on the semiconductor substrate.

An electrode structure (e.g. a source electrode structure, or e.g. a source metal) may be formed on (e.g. directly on the first insulation layer structure. At least part of the electrode structure may be located directly adjacently to the source region and the body region of the transistor structure, for example.

A second insulation layer structure (e.g. a polyimide layer) may be formed on (e.g. directly on the electrode structure.

Optionally, the method 100 may further include forming a laterally varying doping region comprising a second conductivity type in an edge region of a semiconductor substrate. Optionally, the dopants of a first conductivity type may be incorporated into the nearby body region portion of the semiconductor substrate and at least a surface portion of the semiconductor substrate located between the laterally varying doping region and a surface of the semiconductor substrate during the same incorporation process before or after forming the laterally varying doping region.

A region comprising the first conductivity type may be an n-doped region (e.g. caused by incorporating nitrogen N ions, phosphorus P ions, antimony Sb ions or arsenic As ions) or a p-doped region (e.g. caused by incorporating aluminum Al ions, gallium Ga ions or boron B ions). Consequently, the second conductivity type indicates an opposite p-doped region or n-doped region. In other words, the first conductivity type may indicate an n-doping and the second conductivity type may indicate a p-doping or vice-versa.

A first lateral surface or front surface of the semiconductor substrate may be a surface of the semiconductor substrate towards metal layers, insulation layers and/or passivation layers on top of the surface of the substrate or a surface of one of these layers. For example, depths may be measured from the front surface of the semiconductor substrate. For example, a semiconductor substrate front side may be the side at which active elements of the chip are formed. For example, in a power semiconductor chip, a chip front side may be a side of the chip at which the source region and the gate region are formed, and a chip back side may be a side of the chip at which the drain region is formed. For example, more complex structures may be located at the chip front side than at the chip back side.

A lateral surface of the semiconductor substrate may be a substantially even plane (e.g. neglecting unevenness of the semiconductor structure due to the manufacturing process and trenches). For example, the lateral dimension of the lateral surface of the semiconductor substrate may be more than 100 times larger (or more than 1000 times or more than 10000 times) than a maximal height of structures on the main surface. In comparison to a basically vertical edge (e.g. resulting from separating the substrate of the chip from others) of the semiconductor substrate, the lateral surface may be a basically horizontal surface extending laterally. The lateral dimension of the lateral surface of the semiconductor substrate may be more than 100 times larger (or more than 1000 times or more than 10000 times) than a basically vertical edge of the semiconductor substrate 103, for example.

A first lateral direction may be a direction substantially parallel to a lateral surface of the semiconductor substrate, for example. A second lateral direction may be a direction substantially parallel to the lateral surface of the semiconductor substrate, and orthogonal (or perpendicular) to the first lateral direction, for example. A vertical direction may be a direction orthogonal (or perpendicular) to the lateral surface of the semiconductor substrate, for example.

The semiconductor device formed by the method 100 may be a power semiconductor device having a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

The semiconductor substrate may be a silicon-based semiconductor substrate. For example, semiconductor substrate may be wide band gap semiconductor substrate having a band gap larger than the band gap of silicon (1.1 eV). For example, semiconductor substrate may be a silicon carbide (SiC)-based semiconductor substrate, or gallium arsenide (GaAs)-based semiconductor substrate, or a gallium nitride (GaN)-based semiconductor substrate.

In the method 100, the semiconductor substrate may be formed by a FZ or CZ process. In terms of material quality, the process of crucible-free zone growth is superior to the process of crucible pulling (e.g. the CZ process). This relates to the oxygen contamination originating from the crucible environment, for example. With the so-called Magnetic Czochralski material (MCZ), the oxygen incorporation may be significantly reduced by applying a magnetic field during the pulling process and thus the formation of oxygen precipitants may be suppressed.

However, compared to a FZ material, the MCZ-Si shows a significantly higher interstitial oxygen [Oi] concentration, for example. While the typical values for FZ-Si are below $1\cdot10^{16}$ per $cm^3$, they are 2 times greater for the currently available MCZ material, which ranges between $1\cdot10^{17}$ per $cm^3$ and $1\cdot10^{18}$ per $cm^3$. The interstitial oxygen is prone to form complexes which affect the doping ratios, for example. In particular, the interaction with point defects (Si self-interstitials or vacancies) may lead to the formation of so-called thermal donors. Furthermore, unwanted doping or recombination centers (which may be difficult to control) may be formed which arise during process control. This may include the reactions with boron as a dopant for the p-emitter or with a proton irradiation for producing an n-doping, for example.

Therefore, the float zone (FZ) material is used for the manufacture of high-performance devices, for example. For Si power components, an n-doped, float zone—FZ base material may be generally used, where phosphorus is added as a dopant during the pulling process to set the required specific resistance, for example. Alternatively, for a very high-resistivity basic material, a neutron irradiation may be carried out, where, via a core reaction, silicon is converted into phosphorus by Neutron Transmutation Doping (NTD). Due to a small capture cross section for the neutrons, the latter results in a very uniform doping via the Si rod, for example. Thus, it is possible to significantly reduce the radial resistance fluctuations, something that makes the material the ideal solution for the use in the high-voltage range.

The use of FZ material particularly for the series production of IGBTs and diodes in the lower voltage range from, e.g., 400V to 1200V, is relatively expensive, and it also limits the use of disk sizes which exceed 8 inches, for example. In contrast, the crucible-pulled Czochralski (CZ) material or MCZ material which can be manufactured at a significantly cheaper rate is already available for series production for wafer diameters up to 12 inches. However, compared to FZ material, the starting material shows a significantly higher proportion of oxygen due to the high reactivity of the silicon. With the so-called Magnetic Czochralski material (MCZ), the oxygen incorporation is significantly reduced by applying a magnetic field during the pulling process, whereby the material becomes usable for the manufacture of power components.

The concentration of interstitial oxygen [Oi] is at approximately less than or equal to $3*10^{17}$ $cm^{-3}$ in the MCZ pulling process compared to less than or equal to $1*10^{16}$ $cm^{-3}$ for FZ Si. It is important to avoid any interaction of the oxygen with the dopants which are used to set the specific resistance in the drift zone. For example, boron doping of the basic CZ material which may be used to manufacture solar cells results in the degradation of the carrier life time due to the formation of a B—O complex. By contrast, the n-doping of the basic material with phosphorus, which is usual for power components, does not present problems as no P—O— complexes are formed, for example.

However, relatively narrow tolerances of the dopant concentration of the starting material are required for the use in power components, for example. The variation of the specific resistance is at greater than or equal to 15% for MCZ material due to the manufacturing process due to the radial dopant fluctuation (striations) caused by the currents in the liquid phase and the variation via the rod due to the segregation of the dopant in the melt. By contrast, the usual specification for the FZ material used as a standard only allows for a scattering of typically ±10%, where the tolerance limit may vary between 8% and 12% depending on the specification of the data sheet values for the respective chip type, for example.

The method 100 may optionally include setting the basic doping of very high-resistivity, drawn Si material using a special diffusion process to narrow the tolerance. For example, chalcogenides, which are part of the $6^{th}$ main group of the periodic table, such as sulfur, selenium or tellurium may be used here. They act as double donors and have a higher diffusion constant compared to the elements of the $5^{th}$ main group such as phosphorus P, arsenic As or antimony Sb so that high penetration depths may already be realized for process temperatures between 900° C. and 1100° C., for example. For example, for IGBTs and diodes, a Se implantation and diffusion for manufacturing the backside field stop zone may therefore be carried out in series for high-voltage components such as IGBTs and power diodes. In the case of Se doping, no interaction with interstitial oxygen (e.g. no formation of an interfering Se—O complex) has been observed which may be favorable. In this respect, the manufacturing process (e.g. an IGBT), is based on a very high-resistivity intrinsic, or only a weakly n-pre-doped MCZ wafer in which a corresponding Se dose is implanted using ion implantation, for example. This may be followed by a phosphorus deposition (e.g., using a $PH_3$ or $POCl_3$ process) from which a high phosphorus edge concentration results. Here and, if necessary, in a subsequent drive-in step, the Se-diffusion is accelerated by injecting Si self-interstitials from the phosphorus edge layer.

The method 100 may be used for forming a semiconductor device including a 1200V IGBT including a trench cell as is characteristic for an IGBT semiconductor device, for example. Electrical results from wafers in which the base doping was established by the Se deep diffusion may be obtained. The starting material may be a high-resistivity MCZ-Si having a specific resistance of greater than 1000 Ωcm, for example. A Se dose of $4*10^{14}$ dopants per $cm^2$ may be implanted in this material, subsequently a PH3 deposition at 1000° C. for about 4 h, followed by a drive-in step in an inert atmosphere at 1100° C. and for 2 h, for example. A Se dose may be activated here as a base doping which corresponds to a doping level of approx. 69 Ωcm in a PROD device, for example.

FIG. 1B shows a graphical illustration 150 of net doping concentration (dopants per $cm^3$) 151 vs depth (μm) 152 of a body region of a transistor structure. For example, FIG. 1B shows a doping profile in the p-body region of an IGBT including a Se base doping 153 compared to a product reference 154 having a constant base doping.

Line 153 shows a curved doping profile of the doping concentration of the semiconductor substrate (e.g. after removing the highly doped phosphorus edge layer), for example. Line 154 shows a constant base doping of a productive component without a curved doping profile, for example.

Following the removal of the highly doped phosphorus edge layer, the cell structure may be created in the FEOL process block. The high-temperature steps comprised therein may result in a further diffusion of the selenium and thus in a flattening of the concentration gradient. Together with the segregation into the highly doped phosphorus edge layer and/or the out-diffusion during the FEOL block, the curved concentration profile 153 of the Se base doping may result, including a drop in the doping concentration towards the surface and at depth. Thus, at a consistent dose in the base doping, the doping will be higher in the center and lower at the surface and at depth compared to the doping level in a productive component 154 having the constant base doping.

Towards the back side, the drop may partially be compensated for by field stop implantation using proton irradiation following the back thinning in the BEOL block.

For example, the doping profile 153 illustrates a doping of a body region extending vertically to the nearby body region portion of a drift region (e.g. detail shown in FIG. 1E) with a pn-junction between the body region and the nearby body region portion of a drift region. The drift region may comprise a first conductivity type and the body region comprises a second conductivity type. The doping of the drift region between the nearby body region portion and a field stop doping region (or a back side drain or collector doping region) may comprise a curved profile increasing from the nearby body region portion to a portion of the drift region comprising a maximal doping concentration the doping concentration and decreasing from the portion of the drift region comprising the maximal doping concentration to the field stop doping region (or a back side drain or collector doping region). For example, a doping concentration of dopants of the first conductivity type within the drift region at a depth of 10 μm (or 8 μm or 12 μm) may be lower than 80% (or lower than 60% or lower than 40%) of a (local) maximal doping concentration of the drift region between the nearby body region portion and the field stop doping region (or a back side drain or collector doping region). The curved doping profile of the drift region between the nearby body region portion and the field stop doping region (or a back side drain or collector doping region) may be caused by a curved profile of a base doping of the semiconductor substrate. The (local) maximal doping concentration of the drift region (outside the field stop doping portion) may be located at a depth larger than 20 μm (or larger than 30 μm) and/or smaller than 80 μm (or smaller than 60 μm). The drift region may comprise a local minimum of the doping concentration of dopants of the first conductivity type located vertically between a maximal net doping concentration of the nearby body region portion and the maximal (local) doping concentration of the drift region. The local minimum of the doping concentration of dopants of the first conductivity type may be lower than 80% (or lower than 60% or lower than 40%) of a maximal (local) doping concentration of the drift region. For example, a doping concentration of dopants of the first conductivity type within the drift region at a depth of 10 μm or a local minimum of the doping concentration of dopants of the first conductivity type located vertically between a maximal net doping concentration of the nearby body region portion and a maximal doping concentration of a portion of the drift region located at a depth larger than 20 μm (or larger than 40 μm) and smaller than 80 μm (or smaller than 60 μm) may be lower than 80% (or lower than 60% or lower than 40%) of the maximal doping concentration of the portion of the drift region located at the depth larger than 20 μm and smaller than 80 μm.

In many respects, the curved doping profile does not interfere with the performance of the power components and may, on the contrary, even be used to improve the switching characteristics or the cosmic radiation resistance. However, a doping too low below the p-body region results in a deterioration of the switch-on behavior in an IGBT having a trench cell (e.g. IGBT and subsequent generations), for example.

It may be understood that although the examples described herein have been used with respect to curved doping profiles caused by selenium doping, the examples may also be applied when other methods for setting the basic doping (of the semiconductor substrate) are used. For example, a proton irradiation may be taken as a basis for generating curved doping profiles. Furthermore, epitaxy methods or also homogenously doped starting material may be used in order to benefit from the lower on-resistance and the increase in active chip area while maintaining the same blocking capacity.

Figure 1C:
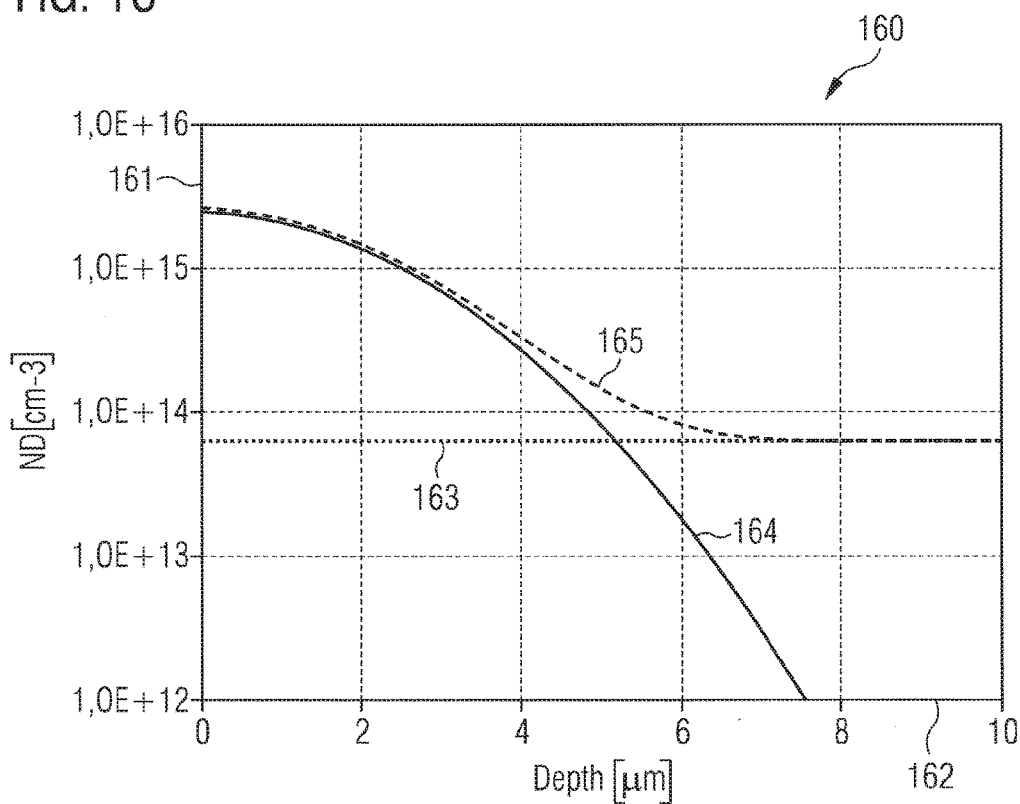
FIG. 1C shows a graphical illustration of a doping concentration vs depth of a nearby body region portion of a semiconductor substrate having a constant base doping.

FIG. 1C shows a graphical illustration 160 of a doping concentration (dopants per cm$^3$) 161 vs depth (μm) 162 of a nearby body region portion of a semiconductor substrate having a constant base doping.

Line 163 shows a doping profile of the base doping of the first conductivity type of the semiconductor substrate before the incorporation 110 of dopants of the first conductivity type. As shown by line 163, the base doping may have a flat or constant doping at the surface of the semiconductor substrate and deeper in the semiconductor substrate, for example.

Line 164 shows a doping profile of a concentration of dopants of the first conductivity type incorporated 110 (e.g. an n-blanket) into the nearby body region portion of the semiconductor substrate.

Line 165 shows a doping profile of the nearby body region portion of the semiconductor substrate after the incorporation 110 (and/or activation) of dopants of the first conductivity (e.g. a sum of base doping and n-blanket doping).

Figure 1D:
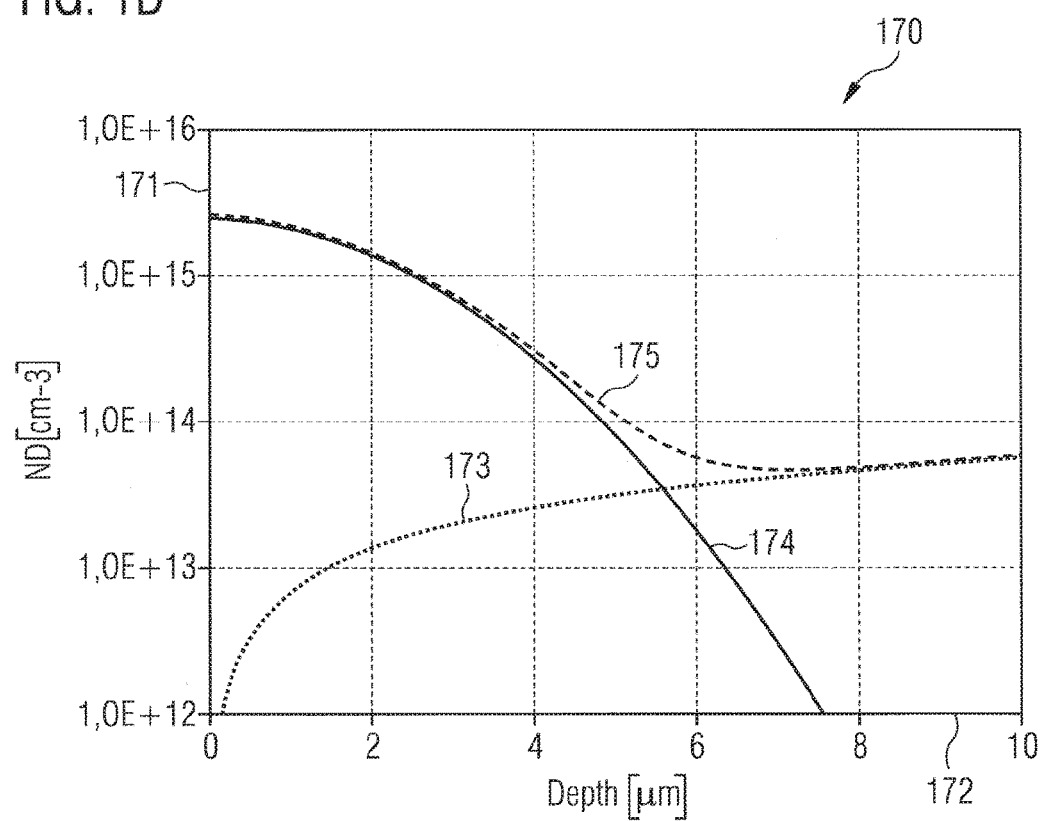
FIG. 1D shows a graphical illustration of a doping concentration vs depth of a nearby body region portion of a semiconductor substrate having a curved base doping.

FIG. 1D shows a graphical illustration 170 of a doping concentration (dopants per cm$^3$) 171 vs depth (μm) 172 of a nearby body region portion of a semiconductor substrate having a curved base doping.

Line 173 shows a doping profile of the base doping of the first conductivity type of the semiconductor substrate before the incorporation 110 of dopants of the first conductivity type. As shown by line 173, the base doping may have a curved doping at the surface of the semiconductor substrate, for example. For example, a drop or a reduction in the doping concentration is present towards the surface of the semiconductor substrate.

Line 174 shows a doping profile of a concentration of dopants of the first conductivity type incorporated 110 (e.g. an n-blanket) into the nearby body region portion of the semiconductor substrate.

Line 175 shows a doping profile of the nearby body region portion of the semiconductor substrate after the incorporation 110 (and/or activation) of dopants of the first conductivity (e.g. a sum of base doping and n-blanket doping).

The method 100 may use the incorporation 110 of the dopants of the first conductivity type into the nearby body region portion of the semiconductor substrate to prevent or avoid the doping being too low below the body region. Thus, the semiconductor device formed by the method of 100 may avoid deterioration of the switch-on behavior of the transistor structure.

To improve the switch-on behavior of IGBTs (e.g. having a Se base doping), an unmasked n-blanket implantation (incorporation 110 of dopants of the first conductivity type) using phosphorus deposition and a small dose of several $10^{11}$ dopants per cm$^2$ (e.g. ranging from between $1*10^{11}$ dopants per cm$^2$ and $1*10^{12}$ dopants per cm$^2$) may be carried out following the PH$_3$ deposition and the optional drive-in step and prior to the beginning of the FEOL process. Thus, the n-doping concentration is raised between the p-body region and the p-float region, something that, as the dose increases, results in a gradually improved drop in forward voltage V_CES alongside the improved switch-on behavior.

In the subsequent thermal budget in the FEOL process, this may result in a diffusion depth of approximately 6 μm and an edge concentration in the order of $1*10^{15}$ dopants per $cm^3$, for example. Hence, the diffusion depth approximately corresponds to the trench depth and thus the desired increase in base doping below the p-body region may be ensured and the accumulation of ICON1 test fails (as described in connection with FIGS. 3A to 4B) may be avoided. For example, following the removal of the phosphorus-doped edge layer in a CMP step, the optional n-blanket implantation may be carried out followed by the actual FEOL block for IGBT manufacturing. This block may include the following high-temperature steps: field oxidation (LOCOS), sacrificial oxidation after trench etching, gate oxidation, body diffusion, source-/p+-anneal and/or the BPSG anneal. During these furnace processes, the phosphorus resulting from the n-blanket implantation may be driven in up to a depth of approx. 6 μm.

The incorporation 110 of dopants of the first conductivity type may lead to a local increase in the near-surface doping concentration in a trench IGBT below the p-body region in wafers having the curved concentration profile of the base doping resulting from the Se deep diffusion. The method 100 may achieve an improved switch-on behavior of the IGBT and in an improved forward voltage drop V_CES.

However, in some circumstances, raising the near-surface doping concentration in the edge termination may have an adverse impact. For example, in case of a field-plate field-ring edge termination (FPFR) as may be used with a 1200V IGBT device, a reduction in blocking voltage is observed if the n-blanket dose reaches the required value to remove the ICON1 fails. Thus, the lightly doped regions between the field rings may be masked with the mask structure. With a suitable design, this may be done via the field oxide if the n-blanket implantation is not carried out prior but directly after the LOCOS growth, for example. The thermal budget for the in-diffusion of the phosphorus is hereby not considerably reduced. For this purpose, a masked n-implantation (instead of an unmasked implantation) may be carried out in the FEOL process block in the dose range (e.g. between $1*10^{11}$ dopants per $cm^2$ and $1*10^{12}$ dopants per $cm^2$) which omits at least the low-dosed regions in the edge termination. Concerning this, the IGBT process sequence may enable the use of the field oxide as an implantation mask so that no additional photo layer (or photo mask) is required, for example.

With a mask structure located adjacently to the edge doping region having the first conductivity type during the incorporation 110 of dopants of the first conductivity type (e.g. whereby the mask structure masks the incorporation 110 of dopants of the first conductivity type into the edge doping region having the first conductivity type), at least part of the edge region (e.g. the low doped areas in the FPFR edge terminations) are masked or omitted, compared to a full-area n-blanket implantation. The low n-doped regions (e.g. edge doping regions of the first conductivity type) between the field rings generated in the p-float implantation may be covered by field oxide (e.g. the mask structure). Thus, the edge doping region having the first conductivity type may maintain the base doping profile (as shown by line 163 and line 173) even after the incorporation 110 of dopants of the first conductivity type.

At first, towards the cell field, this still happens continuously across the p-rings (as shown in FIG. 4). For example, in a transition portion of the edge region the mask structure may be located on (or e.g. mask, or e.g. cover) p-float regions located in the transition portion of the edge region.

However, in the more external rings to which the floating field plates are connected (e.g. in the edge termination portion or FPFR portion of the edge region), the field oxide (mask structure) may be interrupted, but only in the central area of the p-rings for example. If the n-blanket implantation is now no longer carried out at the beginning of the FEOL block but after the field oxidation (e.g. after forming the mask structure), the typically 1300 nm thick LOCOS oxide is able to prevent the phosphorus implantation from taking place in these areas, for example.

Without a mask structure located adjacently to the edge doping region having the first conductivity type during the incorporation 110 of dopants of the first conductivity type (e.g. without the mask structure located at the edge region), the n-blanket implantation between the field rings may be fully activated even in the area of the edge termination where a field plate field ring FPFR edge termination may be located. In case of a productive component (PROD reference) which is, for example, designed for a blocking voltage of 1200V, the Si base material may be homogenously doped with a donor concentration of typically $6*10^{13}$ dopants per $cm^3$. This doping level increases due to the n-blanket implantation in the area between the field rings at the surface. Thus, a locally increased base doping effectively prevails in the edge termination which may directly result in a reduction of the blocking voltage, for example.

More details and aspects are mentioned in connection with the embodiments described above or below. The embodiments shown in FIGS. 1B to 1D may each comprise one or more optional additional features corresponding to one or more aspects mentioned in connection with the proposed concept or one or more embodiments described above (e.g. FIG. 1A) or below (FIGS. 1E to 6).

Figure 1E:
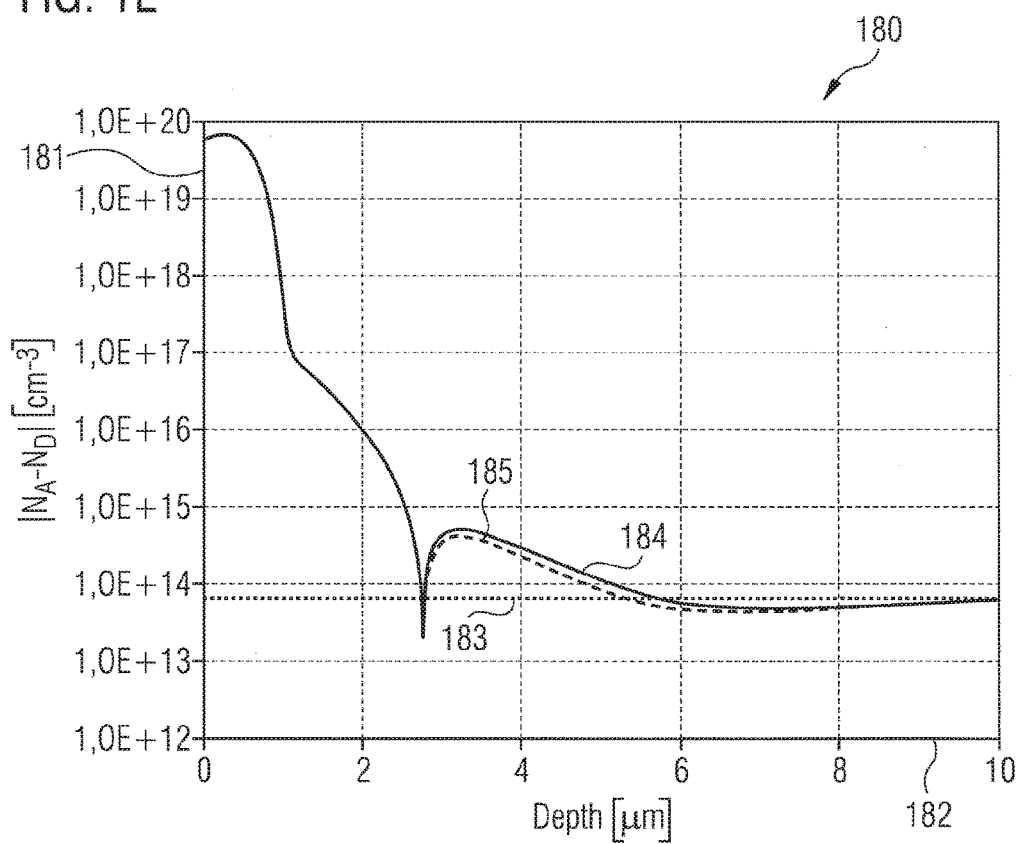
FIG. 1E shows a graphical illustration of net doping concentration vs depth of a body region of a transistor structure with incorporated dopant atoms of the first conductivity type.
Figure 3A:
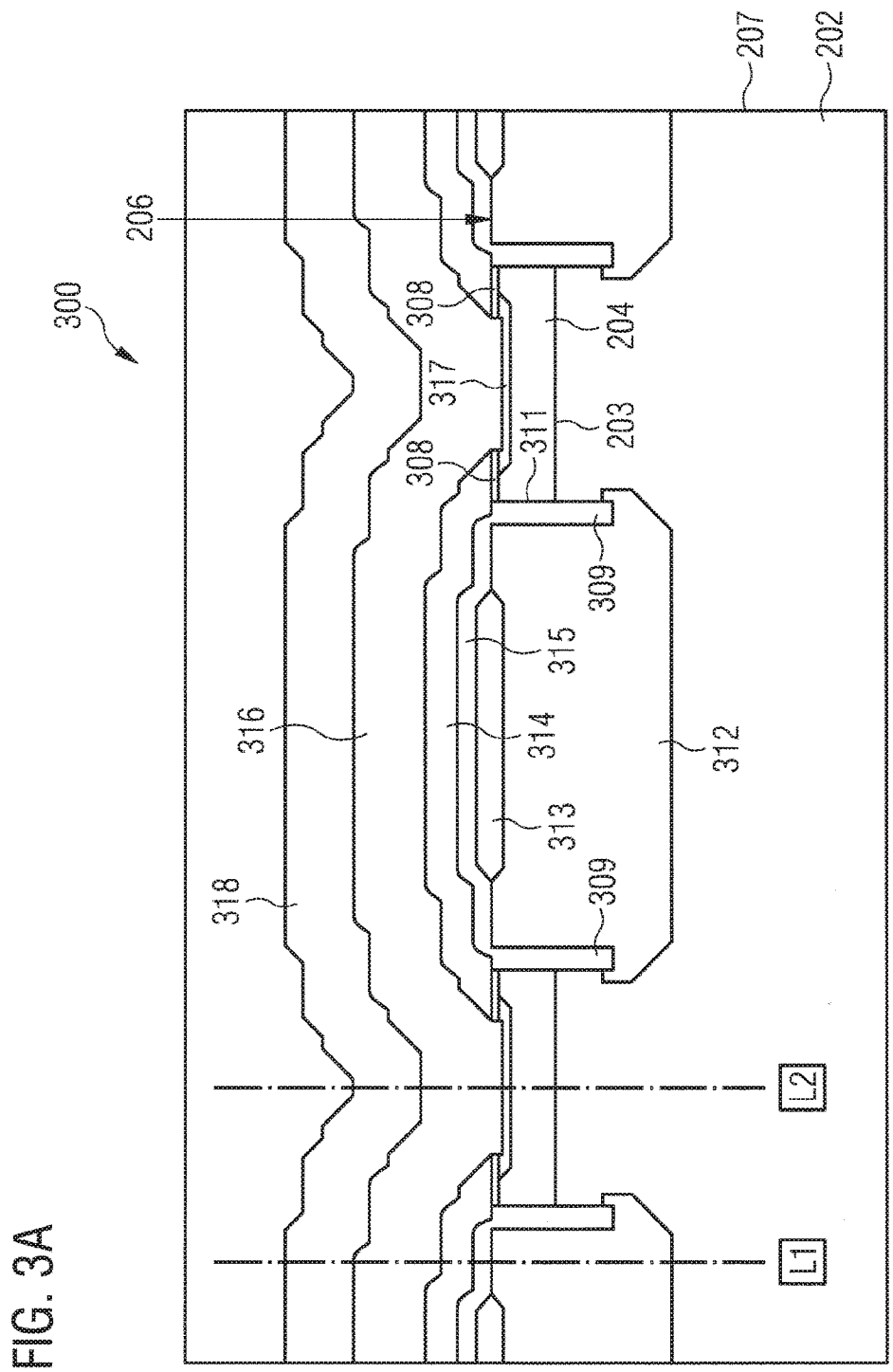
FIG. 3A shows a schematic illustration of a further semiconductor device.

FIG. 1E shows a graphical illustration 180 of net doping concentration (dopants per $cm^3$) 181 vs depth (μm) 182 of a body region and a drift region of a transistor structure after the incorporation of dopants of the first conductivity type. FIG. 1E shows the doping profile (along L2 as shown in FIG. 3A) in an n-blanket implantation prior to and/or after the field oxidation at a dose of $6*10^{11}$ dopants per $cm^2$, for example. The experimental results described below come from 3 experimental groups which are based on a splitting with regard to the n-blanket implantation dose.

Line 183 shows a doping profile for a first group where no implantation was carried out (e.g. base doping level of PROD).

Line 184 shows a doping profile for a second group where a dose of $3 \cdot 10^{11}$ $cm^{-2}$ and/or $6 \cdot 10^{11}$ $cm^{-2}$ was implanted prior to the FEOL block (e.g. with FEOX thermal budget).

Line 185 shows a doping profile for a third group where a dose of $3 \cdot 10^{11}$ $cm^{-2}$ and/or $6 \cdot 10^{11}$ $cm^{-2}$ was implanted after the FEOL block (e.g. without FEOX thermal budget).

Even though the diffusion profile is attenuated by the n-blanket implantation being shifted to the process block after the field oxidation (e.g. after forming the mask structure), this has no significant impact on the final doping distribution and may also be corrected by a slight dose adjustment. In the area of the floating p-rings in which the field oxide is interrupted for subsequently contacting the field plates, the relatively low dose has, however, no adverse effect as the same conditions prevail here as in the p-float regions in the cell field and the n-blanket implantation is fully absorbed by the p-ring. Hence, it can no longer get into the surrounding n-region.

Due to the n-doping having no (or little) impact in the p-float region, the masking of the n-blanket implantation may be carried out via the field oxide in the edge area without any undesirable side effects, for example. (FIG. 4A shows a section of the field plate/field ring edge termination connected to the cell field, for example).

Due to the considerably higher doping concentration in the body region, the n-blanket implantation is overcompensated and has only, as desired, an impact in terms of the junction depth and in the weakly n-doped area under it, for example. In the p-float region, it has minimal or no impact on the doping ratios as both the concentration and the penetration depth of the p-doping are significantly larger all over.

In the BEOL block, the method 100 may further include the wafers being thinned to the end thickness (e.g. of between 100 μm and 300 μm, or e.g. of 120 μm). Subsequently, the collector region may be formed or incorporated by a boron implantation and the field stop may be formed or incorporated by a multiple proton implantation and activated in a tempering step at 400° C. The size of the chip may be approximately 1 cm$^2$, and the active area portion may be 76 mm$^2$, for example. The chip may be dimensioned for a nominal current of 100 A, for example.

More details and aspects are mentioned in connection with the embodiments described above or below. The embodiments shown in FIG. 1E may comprise one or more optional additional features corresponding to one or more aspects mentioned in connection with the proposed concept or one or more embodiments described above (e.g. FIGS. 1A to 1D) or below (FIGS. 2 to 6).

Figure 2:
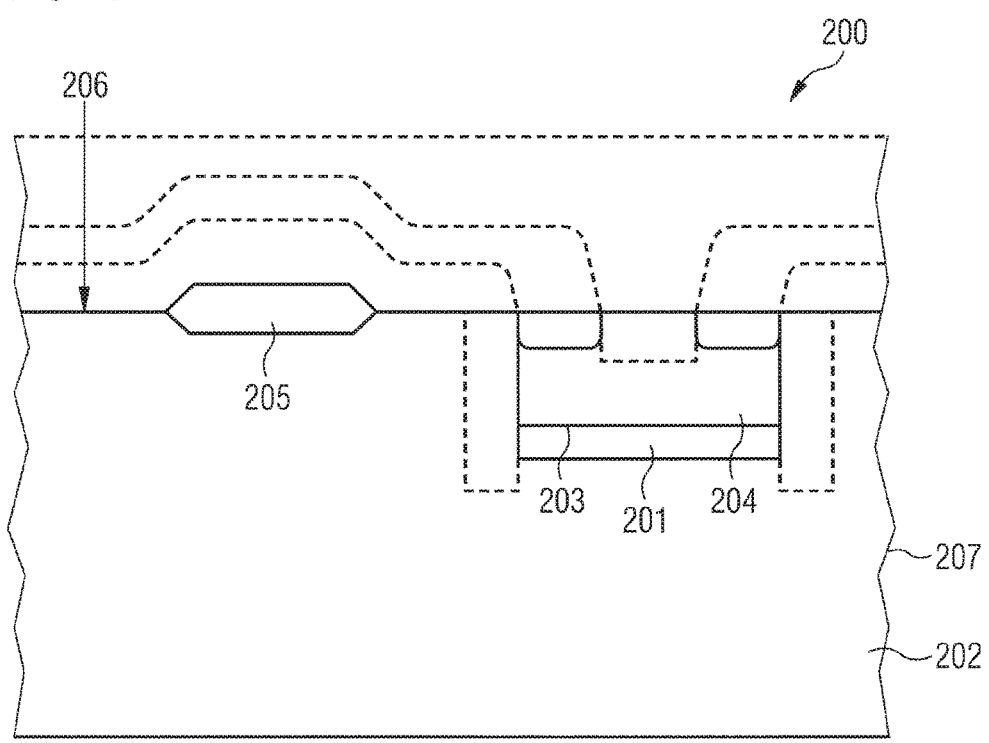
FIG. 2 shows a schematic illustration of a semiconductor device.

FIG. 2 shows a schematic illustration of a semiconductor device 200.

The semiconductor device 200 comprises a nearby body region portion 201 of a drift region 202 of a transistor structure located at a semiconductor substrate 207. The nearby body region portion 201 is located within 1 μm of a p-n junction 203 between a body region 204 of the transistor structure and the drift region 202 of the transistor structure. An average doping concentration of the nearby body region portion 201 is greater than $5*10^{14}$ dopants per cm$^3$.

The semiconductor device 200 further comprises an insulation structure 205 located on a surface 206 of the semiconductor substrate 207 at an edge region of the semiconductor substrate 207. An average doping concentration of at least a portion of the semiconductor substrate 207 located at the same vertical depth in the semiconductor substrate as the nearby body region portion 201 is less than $1*10^{14}$ dopants per cm$^3$.

Due to an average doping concentration of the nearby body region portion 201 being greater than $5*10^{14}$ dopants per cm$^3$, a doping concentration of the nearby body region being too low and leading to a deterioration of the switch-on behavior of the transistor structure may be avoided. Thus, an improved switch-on behavior of the transistor structure and an improved drop in forward voltage of the transistor structure may be achieved. Due to the semiconductor device 200 further comprising an insulation structure 205 located on a surface 206 of the semiconductor substrate 207 at an edge region of the semiconductor substrate 207, a local increase in a doping concentration of the edge region (e.g. an increase in the base doping of the edge region) may be prevented or reduced, and thus, a reduction of the blocking voltage of the transistor structure may be prevented or reduced.

The nearby body region portion 201 of the drift region is located within 1 μm (or e.g. between 1 μm and 3 μm, or e.g. between 1 μm and 2 μm) of the p-n junction 203 between the body region 204 of the transistor structure and the drift region 202 of the transistor structure.

The drift region 202 of the transistor structure may be located in the semiconductor substrate 207. The drift region of the transistor structure may be located between the body region of the transistor structure and a drain region of the transistor structure located at a second lateral surface of the semiconductor substrate 207, for example.

An average doping concentration of the nearby body region portion 201 is greater than $5*10^{14}$ dopants per cm$^3$ (or e.g. between $1*10^{14}$ dopants per cm$^3$ and $1*10^{16}$ dopants per cm$^3$, or e.g. between $5*10^{14}$ dopants per cm$^3$ and $5*10^{16}$ dopants per cm$^3$, or e.g. $1*10^{15}$ dopants per cm$^3$).

The insulation (or dielectric) structure 205 located on the surface 206 of the semiconductor substrate 207 at the edge region of the semiconductor substrate 207 may be a silicon dioxide insulation layer structure (or LOCOS structure), for example. Optionally or alternatively, the insulation structure 205 may be a diamond-like carbon (DLC) layer structure. Optionally or additionally, the insulation structure 205 may be a dielectric layer structure (e.g. including an organic or an inorganic layer)

An average doping concentration of at least a portion (e.g. an edge doping portion of the semiconductor substrate having the first conductivity type) of the semiconductor substrate 207 located at the same vertical depth in the semiconductor substrate as the nearby body region portion 201 is less than $1*10^{14}$ dopants per cm$^3$ (or e.g. less than $1*10^{13}$ dopants per cm$^3$). For example, an average doping concentration of the portion of the semiconductor substrate 207 located vertically adjacently to the insulation structure 205 may be less than $1*10^{14}$ dopants per cm$^3$.

Optionally, the semiconductor 200 may further include a laterally varying doping region comprising a second conductivity type located in an edge region of the semiconductor substrate. The semiconductor device 200) may further include a surface portion of the semiconductor substrate comprising the first conductivity type located between a surface of the semiconductor substrate and the laterally varying doping region.

The drift region may comprise a first conductivity type and the body region comprises a second conductivity type. The doping of the drift region between the nearby body region portion and a field stop doping region (or a back side drain or collector doping region) may comprise a curved profile increasing from the nearby body region portion to a portion of the drift region comprising a maximal doping concentration the doping concentration and decreasing from the portion of the drift region comprising the maximal doping concentration to the field stop doping region (or a back side drain or collector doping region). For example, a doping concentration of dopants of the first conductivity type within the drift region at a depth of 10 μm (or 8 μm or 12 μm) may be lower than 80% (or lower than 60% or lower than 40%) of a (local) maximal doping concentration of the drift region between the nearby body region portion and the field stop doping region (or a back side drain or collector doping region). The curved doping profile of the drift region between the nearby body region portion and the field stop doping region (or a back side drain or collector doping region) may be caused by a curved profile of a base doping of the semiconductor substrate. The (local) maximal doping concentration of the drift region (outside the field stop doping portion) may be located at a depth larger than 20 μm (or larger than 30 μm) and/or smaller than 80 μm (or smaller than 60 μm). The drift region may comprise a local minimum of the doping concentration of dopants of the first conductivity type located vertically between a maximal net doping concentration of the nearby body region portion and the maximal (local) doping concentration of the drift region. The local minimum of the doping concentration of dopants of the first conductivity type may be lower than 80% (or lower than 60% or lower than 40%) of a maximal (local) doping concentration of the drift region. For example, a doping concentration of dopants of the first conductivity type within the drift region at a depth of 10 µm or a local minimum of the doping concentration of dopants of the first conductivity type located vertically between a maximal net doping concentration of the nearby body region portion and a maximal doping concentration of a portion of the drift region located at a depth larger than 20 µm (or larger than 40 µm) and smaller than 80 µm (or smaller than 60 µm) may be lower than 80% (or lower than 60% or lower than 40%) of the maximal doping concentration of the portion of the drift region located at the depth larger than 20 µm and smaller than 80 µm.

The semiconductor device 200 may be formed (or manufactured) by the method described in connection with FIGS. 1A and 1B. The semiconductor device 200 may further include one or more or all of the features of the semiconductor device described in connection with FIGS. 1A and 1B, for example.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIGS. 1A to 1D) or below (FIGS. 3A to 6).

FIG. 3A shows a schematic illustration of a semiconductor device 300. For example, FIG. 3A shows a cross section of an IGBT transistor structure (e.g. an IGBT cell).

The semiconductor device 300 may be formed (or manufactured) by the method described in connection with FIGS. 1A to 1D. The semiconductor device 300 may further include one or more or all of the features of the semiconductor device described in connection with FIGS. 1A to 2, for example.

The semiconductor device 300 may include at least one transistor structure. The source region 308 of the transistor structure, the body region 204 of the transistor structure, the nearby body region portion of the transistor structure, and the drift region 202 may be located adjacently to the first sidewall 311 of the gate trench structure 309. The nearby body region portion of the drift region may be formed adjacent to the body region 204 as described in connection with FIGS. 1A to 2, for example.

The semiconductor device 300 may include the floating doping region 312 (e.g. a p-float region) located between neighboring (or consecutive) gate trench structures 309. The floating doping region 312 may extend vertically from the first lateral surface 206 of the semiconductor substrate 207 into the semiconductor substrate 207, for example. Additionally or optionally, the floating doping region 312 may extend laterally between a sidewall of a first gate trench structure 309 and a sidewall of a second gate trench structure 309. Additionally or optionally, at least part of the floating doping region 312 may be located adjacently to a bottom of each gate trench structure 309. Additionally or optionally, at least part of the floating doping region 312 may extend from a second sidewall of the gate trench structure 309 towards the first sidewall of the (neighboring or next) gate trench structure 309.

The semiconductor device 300 may further include at least one transistor insulation structure 313. The (or each) transistor insulation structure 313 may be a LOCOS structure and may be located laterally between neighboring transistor structures. The transistor insulation structure 313 may be located at the first lateral surface 206 of the semiconductor substrate, for example. The transistor insulation structure 313 may be located vertically adjacent to the floating doping region 312 at the first lateral surface 206 of the semiconductor substrate, for example.

The semiconductor device 300 may further include a first insulation layer structure 314 (e.g. an oxide layer, or e.g. a silicon dioxide layer formed on (or e.g. directly on) the gate electrode material layer 315 located on the transistor insulation structure 313. The first insulation layer structure 314 may electrically insulate the gate trench structure 309 (e.g. the gate electrode) and/or the gate electrode material layer 315 from other electrode structures formed on (or e.g. above) the semiconductor substrate 207, for example. Additionally or optionally, the first insulation layer structure 314 may electrically insulate the source region 308 of the transistor structure from other electrode structures formed on (or e.g. above) the semiconductor substrate 207.

The semiconductor device 300 may further include an electrode structure 316 (e.g. a source electrode structure, or e.g. a source metal) formed on (or e.g. above) the transistor insulation structure 313. The source electrode structure 316 may be formed on (e.g. directly on) the first insulation layer structure 314, for example. At least part of the source electrode structure 316 may be located directly adjacently to the source region 308 and/or the body region 204 of the transistor structure, for example. Optionally, a body-contact portion 317 of the body region 204 may be located adjacent to the source electrode structure 316. The body-contact portion 317 of the body region 204 may have the second conductivity type (e.g. a p+ doping) and may have a higher average doping concentration than other portions of the body region 204, for example.

The semiconductor device 300 may further include a second insulation layer structure 318 (e.g. a polyimide layer) formed on (or e.g. above) the transistor insulation structure 313. The second insulation layer structure 318 may be formed on (e.g. directly on) the source electrode structure 316, for example.

Between the MOSFET cells, the p-float region 312 may confine the hole current in the active cell region. Furthermore, the thick field oxide 313 above the p-float region 312 which is grown in the LOCOS process may serve to reduce the Miller capacitance. In the case of a base doping too low beneath the channel area (e.g. without the nearby body region portion of the drift region), a stronger out-diffusion of the boron doping of the p-float region 312 and the p-body region 204 may occur. Thus, the active area may be constricted or, in an extreme case, an inter-diffusion of the p-float 312 doping and the p-body 204 doping may occur, which may result in a deterioration of the switch-on behavior which manifests itself in a "snapback" behavior in the output characteristic, particularly in the threshold area of the transmission characteristic. For example, to test this fault, an ICON1 test may be performed in the final wafer inspection. In this test, the collector current may be measured at a gate voltage of 15V and a collector voltage of 1V, for example. In case of a faultless component, the value of this current may be a few amperes (e.g., between 1 A and 20 A). In case of an ICON1 test fail, the value is clearly below 1 A.

FIG. 3B shows a graphical illustration 350 of net doping concentration (dopants per cm$^3$) 351 vs depth (µm) 352 in various portions of a semiconductor device (e.g. the vertical doping profiles evaluated along the intersection lines L1 and L2 as shown in FIG. 3A). FIG. 3B shows the near-surface concentration distribution with and without n-blanket implantation, for example. For example, FIG. 3B shows a vertical doping profile 353 of the body region and drift region in the cell field (along intersection line L2 as shown in FIG. 3A) without n-blanket implantation, a vertical doping profile 354 of the body region and drift region (along intersection line L2 as shown in FIG. 3A) with n-blanket implantation, and a vertical doping profile of the p-float region 355 (intersection line L1 as shown in FIG. 3A) across the cell depth.

The doping profile may be based on a p-body region 204 dose of $2.2*10^{13}$ dopants per $cm^2$, a $p^+$-dose body-contact portion 317 of $5*10^{15}$ dopants per $cm^2$, an n-blanket dose of $6*10^{11}$ dopants per $cm^2$ to form the nearby body region portion and a p-float 312 dose of $3*10^{14}$ dopants per $cm^2$, for example.

Line 353 shows a p-n junction between the body region and the drift region of the transistor structure without the incorporation of dopants of the first conductivity type (e.g. the n-blanket implantation) to form the nearby body region portion of the drift region. For example, line 353 shows the cell intersection at L2 with a selenium base doping.

Line 354 shows a p-n junction between the body region and the drift region of the transistor structure with the incorporation of dopants of the first conductivity type (e.g. the n-blanket implantation) to form the nearby body region portion of the drift region to form the nearby body region portion of the drift region. As shown by line 354, the n-blanket implantation by incorporating the dopants of the first conductivity type may lead to an increase in the (average) base doping of the semiconductor substrate by at least one order of magnitude within the nearby body region portion of the semiconductor substrate (compared to line 353). The incorporated dopants may increase the base doping of the semiconductor substrate within a depth of at least 1 µm (or e.g. between 1 µm and 3 µm, or e.g. between 1 µm and 2 µm) from a p-n junction between the body region and the drift region of the transistor structure. For example, line 354 shows the cell intersection at L2 with an n-blanket $I^2$ dose of $6*10^{11}$ dopants per $cm^2$.

Line 355 shows a p-n junction between a floating doping region 312 (p-type doped) and the bulk semiconductor substrate (n-type doped), for example. While the concentration level of the n-doping below the body region (e.g. as shown by line 354) rises considerably due to the n-blanket implantation and even exceeds the concentration level of the PROD device (69 Ωcm corresponds to a base doping of $6.2*10^{13}$ dopants per $cm^3$), such n-doping has little or no impact in the p-float region 312 as its p-doping concentration prevails extensively over the entire diffusion depth.

More details and aspects are mentioned in connection with the embodiments described above or below. The embodiments shown in FIGS. 3A and 3B may each comprise one or more optional additional features corresponding to one or more aspects mentioned in connection with the proposed concept or one or more embodiments described above (e.g. FIGS. 1A to 2) or below (FIGS. 4A to 6).

FIG. 4A shows a schematic illustration of a semiconductor device 400. For example, FIG. 4A shows a transition from the active cell region into the FPFR (field plate field ring) edge termination in an IGBT4 device.

The semiconductor device 400 may include the active cell region in which at least one transistor structure is formed. For example, the transistor structure may include the source electrode structure 316 located directly adjacently to the source region and/or the body region 204 of the transistor structure, for example.

The semiconductor device 400 may include the edge region. The active cell region may be laterally surrounded by the edge region. The edge region may be a ring shaped portion of the semiconductor substrate 207 circumferentially surrounding the active cell region of the semiconductor substrate 207 in a top view of the semiconductor device 400. The edge region may extend from an edge of the semiconductor substrate of the semiconductor device (e.g. a semiconductor die to be formed, or diced or separated) laterally towards the active cell region. The edge region may comprise a lateral width (or thickness) measured from an edge (e.g. a vertical edge) of the semiconductor substrate 207 towards the active region of less than 500 µm and more than 50 µm (or less than 300 µm and more than 100 µm), for example. The edge region of the semiconductor substrate 207 may include an edge termination portion in which the field ring structures may be located. The edge region of the semiconductor substrate 207 may further include a transition portion between the active region and the edge termination portion of the edge region. One or more floating doping regions may be located in the transition portion of the edge region, for example.

The semiconductor device 400 may further include an insulation structure 205 located on a surface (e.g. the first lateral surface) of the semiconductor substrate 207 at the edge region (e.g. at the edge termination portion of the edge region) of the semiconductor substrate 207. The insulation structure 205 located on the surface of the semiconductor substrate 207 at the edge region of the semiconductor substrate 207 may be a silicon dioxide insulation layer structure (or LOCOS structure).

The insulation structure 205 may be located at the surface (e.g. the first lateral surface) of the semiconductor substrate 207 adjacent to (e.g. directly on and/or above) one or more portions of the semiconductor substrate having the first conductivity 419 (e.g. n-type) in the edge region of the semiconductor substrate 207. The at least one edge doping region having the first conductivity type 419 may be located laterally adjacent to at least one edge doping region having the second conductivity type 421 (e.g. also referred to as p-float regions having p-type conductivity) located in the edge region of the semiconductor substrate, for example. Optionally, an edge doping region having the first conductivity type 419 may be located laterally between neighboring (or consecutive) laterally spaced edge doping regions having the second conductivity type 421.

The at least one edge doping region comprising the second conductivity type 421 may be at least part of a field ring structure, for example. The field ring structure may include a field ring body portion 422 which may be located between the p-float portion of the field ring structure and the field ring body portion 422 of the field ring structure. The field ring body portion 422 may have the second conductivity type and a similar doping as the body region of the transistor structure, for example. At least part of the field ring structure may be located directly adjacent to a (floating) field plate electrode structure 423 located at the first lateral surface of the semiconductor substrate 207. An intermediate contact portion of the field ring structure may be located between the field plate electrode structure 423 and other portions of the field ring structure (e.g. between the field plate electrode structure 423 and the field ring body portion 422), for example. The intermediate contact portion of the field ring structure may have the second conductivity type (e.g. a p+ doping), for example.

An average doping concentration of at least a portion (e.g. at least a portion of the semiconductor substrate 207 located vertically adjacent to the insulation structure 205) of the semiconductor substrate 207 located at the same vertical depth in the semiconductor substrate 207 as the nearby body region portion may be less than $1*10^{14}$ dopants per cm$^3$ (or e.g. less than $1*10^{13}$ dopants per cm$^3$). For example, an average doping concentration of the portion of an edge doping portion of the semiconductor substrate having the first conductivity type 419 at the same vertical depth in the semiconductor substrate 207 as the nearby body region portion may be less than $1*10^{14}$ dopants per cm$^3$. The one or more portions of the semiconductor substrate having the first conductivity 419 in the edge region may have an average doping concentration equal to (or e.g. similar to) the average base doping concentration of the semiconductor substrate.

An (average) doping concentration of the at least one edge doping region having the second conductivity type 421 may be at least $1*10^{17}$ dopants per cm$^3$ (or e.g. between $1*10^{17}$ dopants per cm$^3$ and $1*10^{20}$ dopants per cm$^3$, or e.g. between $1*10^{17}$ dopants per cm$^3$ and $1*10^{19}$ dopants per cm$^3$). The average doping concentration of the at least one edge doping region having the second conductivity type 421 may be a measured number of dopants per volume averaged over the at least one edge doping region having the second conductivity type, for example.

The semiconductor device 400 may further include at least one gate electrode structure 424 contacting the gate electrodes (or gate electrode material layers) of the transistor structure. For example, the gate electrode structure 424 may be a gate runner structure, for example. The semiconductor device 400 may further include one or more source electrode portions 425 which may be configured to have source potential or to provide a source potential to the source region of the transistor structure.

The semiconductor device 400 may be formed (or manufactured) by the method described in connection with FIGS. 1A to 1D. The semiconductor device 300 may further include one or more or all of the features of the semiconductor device described in connection with FIGS. 1A to 3B, for example.

Figure 4B:
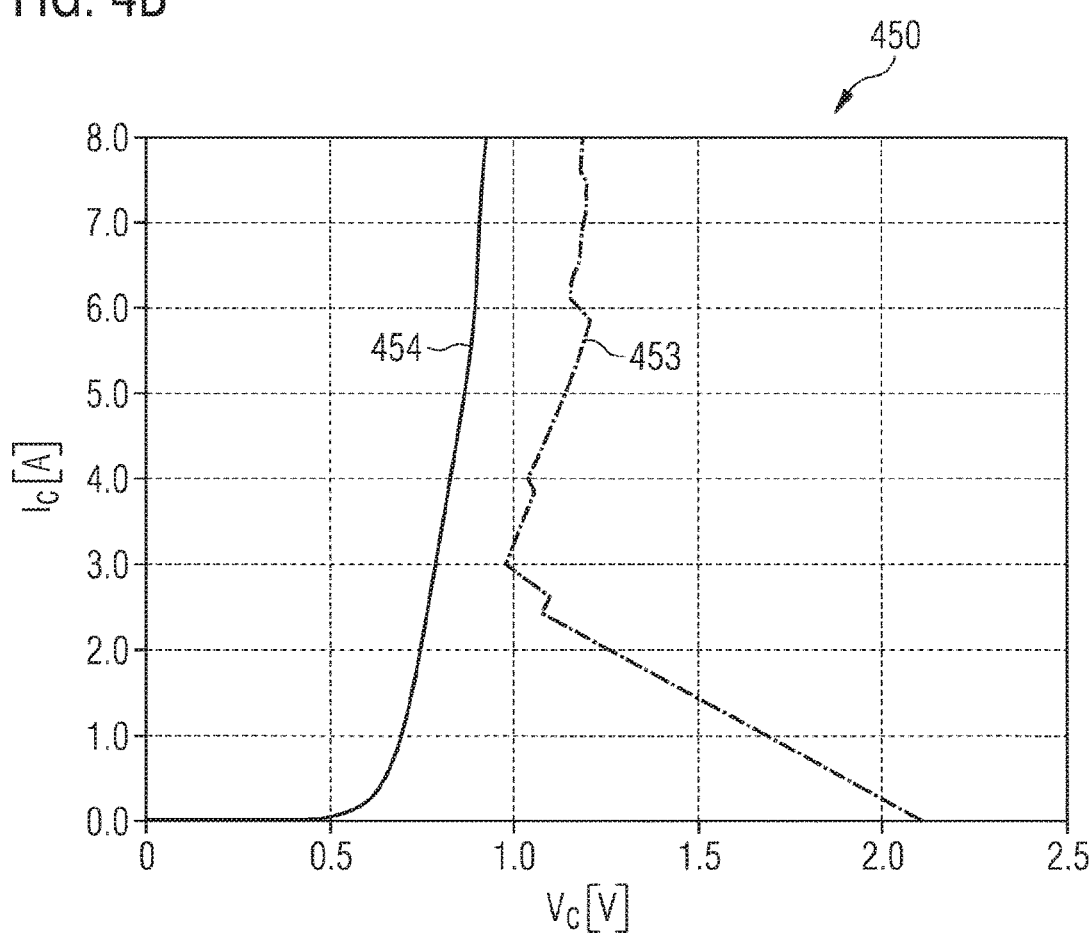
FIG. 4B shows a graphical illustration of a starting range of an output characteristic of an IGBT semiconductor device.

FIG. 4B shows a graphical illustration 450 of the starting range of the output characteristic of an IGBT semiconductor device. FIG. 4B shows the differences in the switch-on behavior including the rise in the output characteristic by varying the collector voltage.

Line 453 shows the output characteristic of a fail chip from the first group where no implantation was carried out to form the nearby body region portion of the drift region (e.g. without n-blanket).

Line 454 shows the output characteristic of a pass chip from the third group where a dose was implanted after the FEOL block to form the nearby body region portion of the drift region (e.g. with an n-blanket dose of $6*10^{11}$ dopants per cm$^2$).

Under the aforementioned ICON1 test condition at a gate voltage of 15V, in which no collector current flows up to a "triggering voltage" of approx. 2V, the mentioned snapback behavior is evident for the fail chip. The subsequent current input is characterized by an irregular characteristic profile. By contrast, the pass chip from the third group is characterized by an increase in current continuously rising as the collector voltage rises and by a smooth characteristic profile.

Furthermore, the forward voltage decreases, which eventually manifests itself in the saturation level of the collector current V_CES as well. Cumulative frequency plots for this value measured at the nominal current of 100 A may demonstrate that the V_CES continuously decreases as the n-blanket dose increases.

From cumulative frequency plots of ICON1 from the wafer test field for the three groups (mentioned in connection with FIG. 4B, it is evident that the collector current rises for the respective ensemble as the implantation dose increases. The (first) group without implantation has only a small share of approximately 2% which meets the specification, for example. All others show a pronounced snapback behavior and are therefore outside the specification limit, for example. Furthermore, the very low scattering concerning the frequency distribution is striking in the implanted groups.

From cumulative frequency plots for the breakdown voltage V_BRCES, it becomes apparent here that the blocking voltage decreases continuously as the n-blanket dose increases, something that is attributable to the mentioned detuning of the doping ratios in the edge termination. Masking the n-blanket implantation in the edge may therefore be used to avoid this blocking loss and to enhance the overall performance of the components, for example.

More details and aspects are mentioned in connection with the embodiments described above or below. The embodiments shown in FIGS. 4A and 4B may each comprise one or more optional additional features corresponding to one or more aspects mentioned in connection with the proposed concept or one or more embodiments described above (e.g. FIGS. 1A to 3B) or below (FIGS. 5A to 6).

FIG. 5A shows a schematic illustration of a flow chart of method 500 for forming a semiconductor device.

The method 500 comprises forming 510 a laterally varying doping region comprising a second conductivity type in an edge region of a semiconductor substrate.

The method 500 further comprises incorporating 520 dopants of a first conductivity type into a nearby body region portion of the semiconductor substrate comprising a base doping of the first conductivity type and into at least a surface portion of the semiconductor substrate located between the laterally varying doping region and a surface of the semiconductor substrate during the same incorporation process before or after forming the laterally varying doping region. A number of dopants of the first conductivity type in the surface portion is larger than a number of dopants of the second conductivity type in the surface portion.

The method 500 further comprises forming 530 a body region of a transistor structure of a second conductivity type in the semiconductor substrate. The nearby body region portion of the semiconductor substrate is located adjacent to the body region of the transistor structure.

Due to the incorporation 520 of the dopants of the first conductivity type into the nearby body region portion of the semiconductor substrate, a doping concentration of the nearby body region portion being too low and leading to a deterioration of the switch-on behavior of the transistor structure may be avoided. Thus, an improved switch-on behavior of the transistor structure and an improved drop in forward voltage of the transistor structure may be achieved. Due to the incorporation 520 of the dopants of the first conductivity type into at least the surface portion of the semiconductor substrate, the semiconductor device may be less sensitive to foreign charges and the space required for the edge termination may be reduced. Thus, the performance of the transistor structure may be improved while maintaining the same chip area, for example. In addition, the manufacturing process for forming the semiconductor device is simplified due to the incorporation 520 of the dopants of the first conductivity type into the nearby body region portion and into at least the surface portion during the same incorporation process, for example.

The laterally varying doping (VLD) region may be formed 510 by incorporating dopants of the second conductivity type through a special mask for lateral dose attenuation when introducing the dopants via implantation. For example, the dopants of the second conductivity type may be incorporated (e.g. implanted) through a resist mask with a laterally varying opening ratio which causes the doping to flow by means of a high temperature process. Optionally or additionally, the laterally varying doping region may be formed by incorporating aluminum or boron dopants into the edge region of the semiconductor substrate.

As the dose use for incorporating the dopants of the second conductivity type decrease from the active cell region towards the edge termination portion of the edge region, a depth of the formed laterally varying doping region decreases from the active cell region towards the edge termination portion of the edge region. For example, the depth of the laterally varying doping region drops (or decreases) towards the edge termination portion compared to the depth of the laterally varying doping region directly adjacent to the active cell region. The depth of the laterally varying doping region at the portion of the laterally varying doping region directly adjacent to (or at) the active cell region may be less than, greater than or equal to a depth of the body region of the transistor structure a floating doping region of the transistor structure, for example.

The laterally varying doping region may be a doping region in which the gradual attenuation of the lateral doping profile is set in such a way that a constant electrical field strength results at the surface of the semiconductor over virtually the entire edge width.

The laterally varying doping region may be located in a transition portion of the edge region of the semiconductor substrate. The transition portion of the edge region may be located directly adjacently to the active cell region of the semiconductor substrate. For example, the transition portion of the edge region may be located between the active cell region and an edge termination portion of the edge region in which field plates or field ring structures may be formed. The laterally varying doping region may be located laterally adjacent (e.g. directly adjacent) to the active cell region. For example, the laterally varying doping region may be located laterally adjacent to the body region of the transistor structure or a float region of the transistor structure, for example.

The dopants of the first conductivity type may be incorporated 520 into the nearby body region portion and at least the surface portion of the semiconductor substrate with an implantation dose of between $1*10^{11}$ dopants per $cm^2$ and $1.5*10^{12}$ dopants per $cm^2$ (or e.g. between $2*10^{11}$ dopants per $cm^2$ and $9*10^{11}$ dopants per $cm^2$, or e.g. between $2*10^{11}$ dopants per $cm^2$ and $7*10^{11}$ dopants per $cm^2$, or e.g. $3*10^{11}$ dopants per $cm^2$, or e.g. $6*10^{11}$ dopants per $cm^2$), for example.

The average base doping concentration of the semiconductor substrate (e.g. before incorporating the dopants of the first conductivity type) may be at least $1*10^{12}$ dopants per $cm^3$ (or e.g. between $1*10^{12}$ dopants per $cm^3$ and $1*10^{14}$ dopants per $cm^3$, or e.g. between $2*10^{13}$ dopants per $cm^3$ and $8*10^{13}$ dopants per $cm^3$, or e.g. $6*10^{13}$ dopants per $cm^3$).

The incorporation 110 of dopants of the first conductivity type may increase the (average) base doping of the semiconductor substrate by at least one order of magnitude within the nearby body region portion of the semiconductor substrate. For example, an average dopant concentration of the nearby body region portion of the semiconductor substrate may be at least $5*10^{14}$ dopants per $cm^3$ (or e.g. between $1*10^{14}$ dopants per $cm^3$ and $1*10^{16}$ dopants per $cm^3$, or e.g. between $5*10^{14}$ dopants per $cm^3$ and $5*10^{16}$ dopants per $cm^3$, or e.g. $1*10^{15}$ dopants per $cm^3$).

The surface portion of the semiconductor substrate is located between the laterally varying doping region and a surface of the semiconductor substrate. For example, the surface portion of the semiconductor substrate may be located directly at the first lateral surface of the semiconductor substrate. Optionally, the dopants of the first conductivity type may be incorporated 520 into the surface portion after forming 510 the laterally varying doping region. The number of dopants of the first conductivity type incorporated into the surface portion may be larger than the number of dopants of the second conductivity type in the surface portion. Thus, the surface portion may have an opposite (or different) conductivity type to the laterally varying doping region. For example, the dopants of the first conductivity type may overcompensate the number of dopants of the second conductivity type in the surface portion.

Alternatively or optionally, the dopants of the first conductivity type may be incorporated 520 into the surface portion before forming the laterally varying doping region.

A depth of the surface portion (after dopant activation) may be equal (or similar or comparable) to a depth of the nearby body region portion (after dopant activation) extending into the semiconductor substrate. Optionally, a depth of the surface portion (after dopant activation) may be smaller than a depth of the nearby body region portion (after dopant activation) extending into the semiconductor substrate.

The method 500 further comprises forming a body region 530 of a transistor structure of a second conductivity type in the semiconductor substrate. The body region may be formed 530 after incorporating 110 the dopants of the first conductivity type into the nearby body region portion and the surface portion of the semiconductor substrate, for example. The forming 530 of the body region of the transistor structure may include incorporating dopants of the second conductivity type into the semiconductor substrate. After the dopant activation (by annealing), the body region may be located adjacent to the nearby body region portion of the semiconductor substrate, for example.

The method 500 may further include one or more annealing processes for forming a p-n junction between the surface portion and the laterally varying doping region. Optionally, the one or more annealing processes may be the same annealing process for activating dopants in the nearby body region portion and the body region.

The method 500 may further include forming an insulation (or dielectric) layer structure, a silicon dioxide layer (e.g. a LOCOS layer), a diamond like carbon layer (DLC layer) or an organic or inorganic dielectric layer at the surface of the semiconductor substrate after forming the laterally varying doping region and before incorporating the dopants of the first conductivity type.

The method 500 introduces a local increase in the near-surface doping concentration by an n-blanket implantation in the dose range between $1*10^{11}$ dopants per $cm^2$ and $1*10^{12}$ dopants per $cm^2$ in trench IGBT wafers having a curved concentration profile of the basis doping resulting from a Se deep diffusion. The latter leads to an improved switch-on behavior of the IGBT cell and to a reduced drop in forward voltage, V_CES, for example. To avoid the associated deteriorations concerning the blocking capability as they occur (e.g., in an FPFR edge termination), a combination with a VLD edge termination which exhibits a near-surface zone of the conduction type opposite to the VLD doping and having a laterally constant dose may be used. Optimization of the latter also requires dose values in the order of magnitude stated, for example.

In case of an unfavorable design of a FPFR edge termination (e.g. if a LOCOS structure cannot be implemented), an additional photo layer may be necessary. By combining the curved concentration profile in the basis doping and an edge termination which is insensitive to a n-blanket implantation and thus an increase in near-surface n-doping, any such masking becomes unnecessary, for example.

The method 500 combines the Se deep diffusion and a VLD edge termination which comprises a near-surface zone of the conduction type opposite to the VLD doping and having a laterally constant dose, for example. The method 500 uses an unmasked n-blanket implantation because in both cases (e.g. the increase in n-doping in the cell field and the partial compensation in the VLD edge) dose values in the same order of magnitude may be used. The device becomes more insensitive to foreign charges compared to VLD doping without the near-surface zone and the space required for the edge termination may be reduced, for example. Thus, the IGBT performance may be improved overall while maintaining the same chip area. The nominal current becomes stronger by increasing the active area, and the switch-on resistance and the forward voltage V_CES may decrease. In addition, the curved doping profile may have a positive impact in terms of the switching characteristics.

The examples described herein may relate to a 1200V trench IGBT semiconductor device. The doping ratios of a partially compensated VLD edge termination whose near-surface compensation region is produced in parallel to the n-blanket implantation for the cell region may be considered. The n-blanket implantation may be carried out after the LOCOS process, and the boron implantation for the VLD region directly at the beginning of the FEOL block as the boron may benefit with respect to indiffusion as there is no significant difference between the diffusion coefficients for boron and phosphorus. For instance, the coefficient for phosphorus is approx. 3% higher compared to the coefficient for boron at the highest temperature in the FEOL process of 1185° C.

The FEOL block for the IGBT manufacture comprises the following high-temperature steps: field oxidation (LOCOS), sacrificial oxidation after trench etching, gate oxidation, body diffusion, source-/p$^+$ anneal and the BPSG anneal. During these furnace processes, the phosphorus (or dopants) resulting from the n-blanket implantation may be driven in up to a depth of approximately 6 µm, for example.

The basic material doping in a productive 1200V IGBT may be $6.2*10^{13}$ dopants per cm$^3$, which corresponds to a specific resistance of 69 Ωcm. The drop-in concentration level which exists in case of the Se basis doping is of minor importance due to the considerably higher concentration level resulting from the n-blanket doping so that the outcome for the doping ratios in the edge termination is virtually the same in both cases, for example.

To achieve maximum blocking capacity, the doping ratios in a VLD edge may be chosen to ensure that the net doping dose (calculated on the basis of the integral over the concentration profile for acceptors and donors in vertical direction) at the beginning of the VLD zone corresponds to the breakdown charge of approx. $1.5*10^{12}$ per cm$^2$ for silicon.

FIG. 5B shows a graphical illustration 550 of doping concentration (dopants per cm$^3$) 551 vs depth (µm) 552 at the beginning of the VLD zone.

Line 553 shows a doping concentration of boron forming the laterally varying doping region.

Line 554 shows a doping concentration of phosphorus forming the surface portion.

Line 555 shows the net doping concentration due to the doping concentration of boron and the doping concentration of phosphorus.

An implantation dose for boron (for forming the VLD zone) may be $3*10^{12}$ dopants per cm$^2$ and a (laterally constant) phosphorus dose (for forming the surface portion) may be $6*10^{11}$ per cm$^2$, for example. In effect, this may result in an electrically active boron dose of $2*10^{12}$ dopants per cm$^2$. Thus, the net dose amounts to $1.4*10^{12}$ per cm$^2$. At this point, the acceptor concentration (line 553) exceeds the n-doping (line 554) over the entire diffusion depth and thus no p-n junction can yet form at the surface (e.g. between the surface portion and the VLD zone).

FIG. 5C shows a graphical illustration 560 of doping concentration (dopants per cm$^3$) 561 vs depth (µm) 562 at the beginning of the VLD zone using a different boron dose.

Line 563 shows a doping concentration of boron forming the laterally varying doping region.

Line 564 shows a doping concentration of phosphorus forming the surface portion.

Line 565 shows the net doping concentration due to the doping concentration of boron and the doping concentration of phosphorus.

If the boron dose (via the VLD implantation mask) is reduced to $1*10^{12}$ dopants per cm$^2$ as a starting value in the lateral direction, the situation may be different. In this case, the constant phosphorus dose (line 564) may locally overcompensate for the electrically active boron dose of $7*10^{11}$ dopants per cm$^2$ (line 563) which is effective after the diffusion, so that an n-doped zone results at the surface. This is shown by the p-n junction (line 565) formed between the surface portion and the VLD zone near the surface of the semiconductor substrate.

If LOCOS growth takes places in the VLD zone, a higher dose provision may be required in the boron implantation due to the higher level of segregation, which, however, has ultimately no appreciable effect on the concentration profile. Thus, when using boron as an acceptor element for the VLD doping, a laterally limited formation of a surface zone having an opposite conduction type should be expected which is only effective in the outer region of the edge termination. Even though, with a corresponding coordination of the dose values and the lateral dose profile in the VLD design, this has no fundamental consequences for the blocking capacity, a certain sensitivity to process fluctuations, and thus a certain scattering of the breakdown voltage values, should be expected as the net dose becoming apparent results from the subtraction of two large numbers.

Figure 5D:
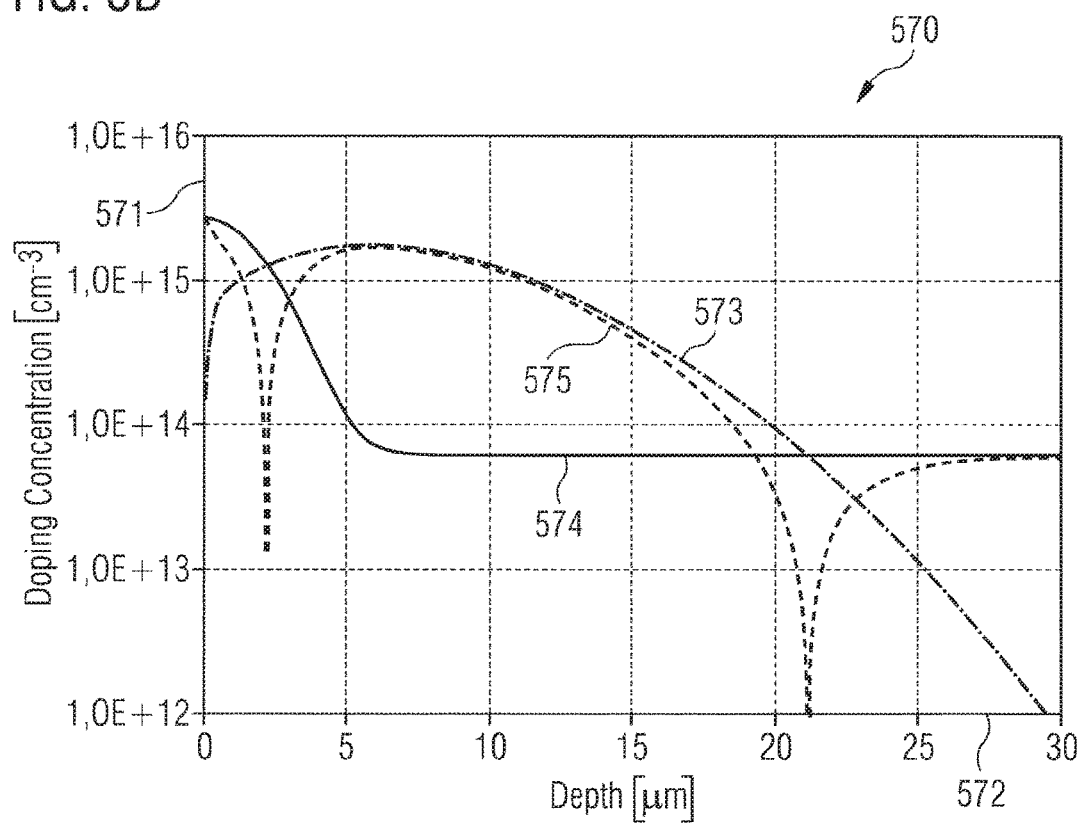
FIG. 5D shows a graphical illustration of doping concentration vs depth at an edge region of the semiconductor substrate using different dopants.
Figure 6:
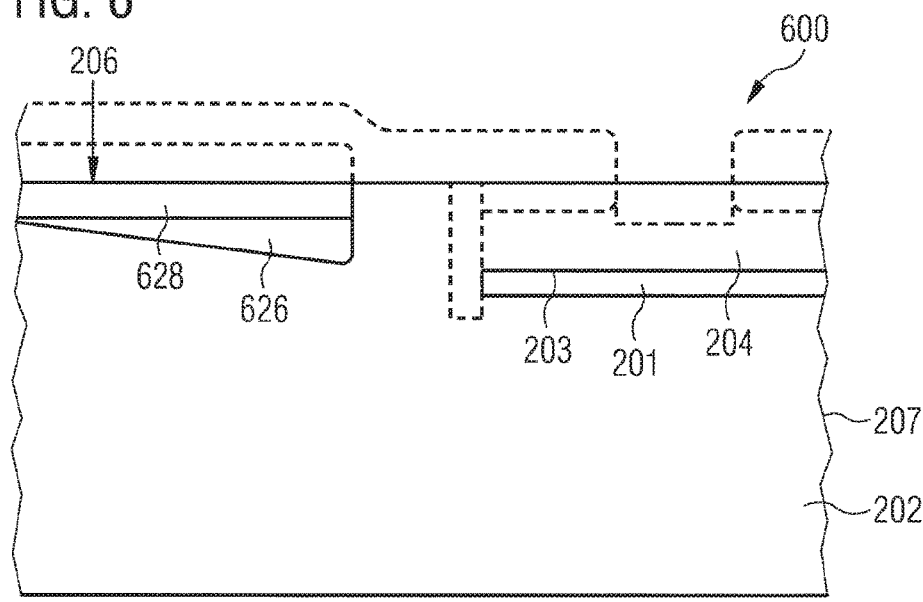
FIG. 6 shows a schematic illustration of a further semiconductor device comprising a laterally varying doping region.

FIG. 5D shows a graphical illustration 570 of doping concentration (dopants per cm$^3$) 571 vs depth (µm) 572 at the beginning of the VLD zone using a different dopant (e.g. aluminum) for forming the laterally varying doping region.

Line 573 shows a doping concentration of aluminum forming the laterally varying doping region.

Line 574 shows a doping concentration of phosphorus forming the surface portion.

Line 575 shows the net doping concentration due to the doping concentration of boron and the doping concentration of phosphorus.

FIG. 5D shows the outcome achieved if an acceptor that will diffuse more rapidly (e.g., Al) is used. Assuming the same boundary conditions (assuming no LOCOS structures) for the indiffusion, the compensation regions may be more clearly separated here from one another. At the temperature of 1185° C., the diffusion coefficient for aluminum may be larger than the one for phosphorus by a factor of approximately 13.

Furthermore, the aluminum at the surface may be more prone to segregation into the oxide and to out-diffusion than the boron. By nature, this may automatically result in the depletion of the acceptor concentration which facilitates the overcompensation further. This means that the n-doped surface zone may already form over the p-region from the beginning of the VLD zone. This is emphasized by a process simulation having the following parameters: The implantation dose of aluminum may be $1.2*10^{13}$ dopant per cm$^2$ and the n-blanket implantation dose of phosphorus may be $6*10^{11}$ dopants per cm$^2$. After the diffusion, an electrically active aluminum dose of $2*10^{12}$ dopants per cm$^2$ may be found in the silicon. In the integration, the non-compensated p share results in approximately $1.5*10^{12}$ dopants per cm$^2$. This value therefore corresponds to the required doping ratios at the beginning of the VLD zone.

As illustrated by the diffusion profiles in FIG. 5D, the formation of a near-surface n-doped edge layer is clearly evident. Thus, in this example, the n-doped surface zone forms over the entire VLD region. Furthermore, the net doping arises from a considerably weaker overcompensation, something that is likely to lead to a better reproducibility of the breakdown voltage values.

More details and aspects are mentioned in connection with the embodiments described above or below. The embodiments shown in FIGS. 5A to 5D may each comprise one or more optional additional features corresponding to one or more aspects mentioned in connection with the proposed concept or one or more embodiments described above (e.g. FIGS. 1A to 4B) or below (FIG. 6).

FIG. 6 shows a schematic illustration of a semiconductor device 600.

The semiconductor device 600 comprises a nearby body region portion 201 of a drift region 202 of a transistor structure located at a semiconductor substrate 207. The nearby body region portion 201 is located within 1 μm of a p-n junction 203 between a body region 204 of the transistor structure and the drift region 202 of the transistor structure. An average doping concentration of the nearby body region portion 201 is greater than $5*10^{14}$ dopants per cm$^3$. The semiconductor device 600 further comprises a laterally varying doping region 626 comprising a second conductivity type located in an edge region of the semiconductor substrate 207. The semiconductor device 600 further comprises a surface portion 628 of the semiconductor substrate comprising the first conductivity type located between a surface 206 of the semiconductor substrate 207 and the laterally varying doping region 626.

Due to the average doping concentration of the nearby body region portion 201 being greater than $5*10^{14}$ dopants per cm$^3$, an improved switch-on behavior of the transistor structure and an improved drop in forward voltage of the transistor structure may be achieved. Due to the semiconductor device 600 comprising a surface portion 628 of the semiconductor substrate comprising the first conductivity type located between the surface 206 of the semiconductor substrate 207 and the laterally varying doping region 626, the semiconductor device may be less sensitive to foreign charges and the space required for the edge termination may be reduced. Thus, the performance of the transistor structure may be improved while maintaining the same chip area, for example.

The nearby body region portion 201 of the drift region is located within 1 μm (or e.g. between 1 μm and 3 μm, or e.g. between 1 μm and 2 μm) of the p-n junction 203 between the body region 204 of the transistor structure and the drift region 202 of the transistor structure.

The drift region 202 of the transistor structure may be located in the semiconductor substrate 207. The drift region of the transistor structure may be located between the body region of the transistor structure and a drain region of the transistor structure located at a second lateral surface of the semiconductor substrate 207, for example.

An average doping concentration of the nearby body region portion 201 is greater than $5*10^{14}$ dopants per cm$^3$ (or e.g. between $1*10^{14}$ dopants per cm$^3$ and $1*10^{16}$ dopants per cm$^3$, or e.g. between $5*10^{14}$ dopants per cm$^3$ and $5*10^{16}$ dopants per cm$^3$, or e.g. $1*10^{15}$ dopants per cm$^3$).

The laterally varying doping region 626 may be a doping region in which the gradual attenuation of the lateral doping profile is set in such a way that a constant electrical field strength results at the surface of the semiconductor over virtually the entire edge width.

The edge region may be a ring shaped portion of the semiconductor substrate 207 circumferentially surrounding the active cell region of the semiconductor substrate 207 in a top view of the semiconductor device.

The surface portion 628 of the semiconductor substrate 207 comprising the first conductivity type located between a surface 206 of the semiconductor substrate 207 and the laterally varying doping region 626.

An average depth of the surface portion 628 (after dopant activation) may be equal (or similar or comparable) to a depth of the nearby body region portion (after dopant activation) extending into the semiconductor substrate. Optionally, the average depth of the surface portion 628 (after dopant activation) may be smaller than a depth of the nearby body region portion (after dopant activation) extending into the semiconductor substrate. Optionally, an average depth of the surface doping region 628 may be larger than an average depth of the body region of the transistor structure.

An average doping concentration of the surface doping portion 628 may be greater than $5*10^{14}$ dopants per cm$^3$ (or e.g. between $1*10^{14}$ dopants per cm$^3$ and $1*10^{16}$ dopants per cm$^3$, or e.g. between $5*10^{14}$ dopants per cm$^3$ and $5*10^{16}$ dopants per cm$^3$, or e.g. $1*10^{15}$ dopants per cm$^3$).

The transistor structure of the semiconductor device may have a breakdown voltage or blocking voltage of more than 10V (e.g. a breakdown voltage of 10 V, 20 V or 50V), more than 100 V (e.g. a breakdown voltage of 200) V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

More details and aspects are mentioned in connection with the embodiments described above or below. The embodiments shown in FIG. 6 may comprise one or more optional additional features corresponding to one or more aspects mentioned in connection with the proposed concept or one or more embodiments described above (e.g. FIGS. 1A to 5D) or below.

Various examples relate to an IGBT with improved switching behavior. Various examples relate to an IGBT with improved switching behavior and partly compensated VLD edge termination region.

Aspects and features (e.g. the nearby body region, the drift region, the transistor structure, the semiconductor substrate, the p-n junction between the body region and the drift region, the insulation structure, the edge region of the semiconductor substrate, the laterally varying doping region, the surface portion, the gate trench structure, the floating doping region, the transistor insulation structure, the gate electrode material layer, the first insulation layer structure and the second insulation layer structure) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
   forming a laterally varying doping region comprising a second conductivity type in an edge region of a semiconductor substrate;
   incorporating dopants of a first conductivity type into a nearby body region portion of the semiconductor substrate comprising a base doping of the first conductivity type and into at least a surface portion of the semiconductor substrate located between the laterally varying doping region and a surface of the semiconductor substrate during the same incorporation process before or after forming the laterally varying doping region, wherein a number of dopants of the first conductivity type in the surface portion is larger than a number of dopants of the second conductivity type in the surface portion; and
   forming a body region of a transistor structure of a second conductivity type in the semiconductor substrate, wherein the nearby body region portion of the semiconductor substrate is located adjacent to the body region of the transistor structure.

2. The method of claim 1, wherein the dopants of the first conductivity type are incorporated with an implantation dose of between $1*10^{11}$ dopants per $cm^2$ and $1.5*10^{12}$ dopants per $cm^2$.

3. The method of claim 1, wherein the base doping concentration of the semiconductor substrate is at least $1*10^{12}$ dopants per $cm^3$.

4. The method of claim 1, wherein a doping concentration of the base doping at a depth equal to a maximal depth of the body region is lower than 80% of a maximal doping concentration of the base doping of the semiconductor substrate.

5. The method of claim 1, wherein the incorporation of dopants of the first conductivity type increases the base doping of the semiconductor substrate by at least one order of magnitude within the nearby body region portion of the semiconductor substrate.

6. The method of claim 1, wherein the incorporation of dopants of the first conductivity type increases the base doping of the semiconductor substrate within a depth of at least 1 μm from a p-n junction between the body region and the drift region of the transistor structure.

7. The method of claim 1, further comprising forming a dielectric layer structure at the surface of the semiconductor substrate after forming the laterally varying doping region and before incorporating the dopants of the first conductivity type.

8. The method of claim 1, further comprising one or more annealing processes for forming a p-n junction between the surface portion and the laterally varying doping region.

9. The method of claim 1, wherein the laterally varying doping region is formed by incorporating gallium, aluminum or boron dopants into the edge region of the semiconductor substrate.

* * * * *